(12) United States Patent
Makino et al.

(10) Patent No.: US 10,203,462 B2
(45) Date of Patent: Feb. 12, 2019

(54) PHOTOELECTRIC SENSOR

(71) Applicant: Keyence Corporation, Osaka-shi, Osaka (JP)

(72) Inventors: Kazuhiro Makino, Osaka (JP); Akinori Nagata, Osaka (JP)

(73) Assignee: KEYENCE CORPORATION, Osaka (JP)

( * ) Notice: Subject to any disclaimer, the term of this patent is extended or adjusted under 35 U.S.C. 154(b) by 0 days.

(21) Appl. No.: 15/928,518

(22) Filed: Mar. 22, 2018

(65) Prior Publication Data

US 2018/0284375 A1 Oct. 4, 2018

(30) Foreign Application Priority Data

Mar. 29, 2017 (JP) ................. 2017-066459

(51) Int. Cl.
| | |
|---|---|
| G02B 6/36 | (2006.01) |
| G02B 6/42 | (2006.01) |
| G01D 7/06 | (2006.01) |
| H01L 27/146 | (2006.01) |
| H01L 27/30 | (2006.01) |

(52) U.S. Cl.
CPC ............. G02B 6/4292 (2013.01); G01D 7/06 (2013.01); H01L 27/14643 (2013.01); H01L 27/304 (2013.01)

(58) Field of Classification Search
CPC .. G02B 6/4214; G02B 6/4292; G02B 6/4284; G02B 6/36
See application file for complete search history.

(56) References Cited

U.S. PATENT DOCUMENTS

| | | | |
|---|---|---|---|
| 8,346,510 B2 * | 1/2013 | Fukumura | H04L 12/40013 702/188 |
| 8,378,780 B2 * | 2/2013 | Hanada | H04L 12/40013 340/3.3 |
| 9,841,808 B2 | 12/2017 | Hanada | |

FOREIGN PATENT DOCUMENTS

| | | |
|---|---|---|
| JP | 1-77234 | 5/1989 |
| JP | 5-23178 | 3/1993 |
| JP | 6-85644 | 3/1994 |
| JP | 2002-71553 | 3/2002 |
| JP | 2006-351380 | 12/2006 |

OTHER PUBLICATIONS

U.S. Appl. No. 15/928,499, filed Mar. 22, 2018, Shinichiro Otsu, Keyence Corporation.

* cited by examiner

Primary Examiner — Jennifer Doan

(57) ABSTRACT

A photoelectric sensor includes a connecting section for light projection to which a light propagation member for light projection optically coupled to a light emitting element is connected, a connecting section for light reception to which a light propagation member for light reception optically coupled to a light receiving element is connected, a signal generating unit configured to compare a light reception signal generated by the light receiving element and a threshold and generate a detection signal indicating a result of the comparison, an light emitting element for indication optically coupled to at least one of the connecting section for light reception and the connecting section for light projection and configured to emit visible light, and a control unit configured to light the light emitting element for indication on the basis of an instruction from an outside.

20 Claims, 18 Drawing Sheets

PHOTOELECTRIC SENSOR

CROSS-REFERENCE TO RELATED APPLICATIONS

The present application claims foreign priority based on Japanese Patent Application No. 2017-066459, filed Mar. 29, 2017, the contents of which is incorporated herein by reference.

BACKGROUND OF THE INVENTION

1. Field of the Invention

The present invention relates to a photoelectric sensor and, more particularly, to a photoelectric sensor of a separation type including a light projecting and receiving unit optically coupled to a controller through a light propagation member such as an optical fiber.

2. Description of the Related Art

JP-UM-A-1-77234 (Patent Literature 1) discloses a photoelectric sensor of a reflection type that can be confirmed an operating state with a distal end portion of a light propagation member, that is, an optical fiber. The photoelectric sensor is a photoelectric sensor of a separation type including a light projecting element for detection (an LED) optically coupled to an end of an optical fiber for light projection and a light receiving element (a photodiode) optically coupled to an end of an optical fiber for light reception. A plurality of optical fibers for operation display are disposed around the optical fiber for light projection. The photoelectric sensor further includes a first plurality of LEDs for operation display and a first plurality of LEDs for stable operation display optically coupled to ends of the plurality of optical fibers for operation display. Similarly, the photoelectric sensor further includes, around the optical fiber for light reception, a second plurality of LEDs for operation display and a second plurality of LEDs for stable operation display optically coupled to ends of the plurality of optical fibers for operation display.

During normal operation, detection light from the light projecting element (the LED) is projected by the optical fiber for light projection. When the light is reflected by an object, the reflected light is detected by the light receiving element through the optical fiber for light reception.

When the light reception is stable, that is, in a state in which the object is stably detected by a comparator circuit having a threshold level higher than a threshold level, the first and second LEDs for stable operation display are lit. This state can be confirmed by the distal ends of the optical fibers. When the object is detected, the first and second LEDs for operation display are lit. The detection can be confirmed by the distal ends of the optical fibers.

JP-A-6-85644 (Patent Literature 2) proposes a photoelectric sensor having a purpose of simplifying positioning of an optical system, that is, relative positioning of an optical fiber for light projection and an optical fiber for light reception, that is, optical axis alignment in setting of the photoelectric sensor in a production line based on the premise that a main body, that is, a controller of a separation-type photoelectric sensor includes an operation display lamp and a stable operation display lamp.

In the photoelectric sensor proposed by Patent Literature 2, an LED for light projection (red) and an LED for display (green) are disposed side by side. The LEDs are optically coupled to a common optical fiber for light projection (detection optical system). During detecting operation, both of the LED for light projection (red) and the LED for display (green) are lit. Light having an orange color obtained by mixing red and green is emitted from the distal end of the optical fiber for light projection. When an object is detected and a detection value of the detection stabilizes, a stable operation display lamp is lit and the LED for display (green) is extinguished. Consequently, the color of the distal end of the optical fiber for light projection changes from orange to red. A stable operation state of the photoelectric sensor can be confirmed according to the change of the color.

In alignment of the optical fiber for light projection and the optical fiber for light reception of the photoelectric sensor, by performing position adjustment while confirming the change of the color of the distal end of the optical fiber for light projection, it is possible to accurately position the optical fiber for light projection and the optical fiber for light reception to bring the photoelectric sensor into the stable operation state.

That is, the relative positioning of the optical fibers for light projection and reception is performed while confirming the operation display lamp and the stable operation display lamp of the controller. Therefore, when relative positioning work of the optical fibers for light projection and reception, that is, work of the optical axis alignment is performed in a place away from the controller, the relative positioning of the optical fibers for light projection and reception is substantially difficult. In order to solve this problem, Patent Literature 2 proposes to dispose an LED for display side by side with an LED for light projection in the controller. This makes it possible to induce, using an optical fiber optically coupled to the LED for light projection, light of the LED for display to the distal end of the optical fiber. Patent Literature 2 also proposes to light both of the LED for light projection (red) and the LED for display (green) when the object is detected and light the stable operation display lamp and extinguish the LED for display when the detection of the object stabilizes. Consequently, the color of the light emitted from the distal end of the optical fiber for light projection is changed from orange to red. According to the change of the color, it is possible to confirm the stable operation state of the photoelectric sensor even if the stable operation display lamp of the controller is not confirmed.

JP-A-2002-71553 (Patent Literature 3) discloses a separation-type photoelectric sensor including a single detection head and a controller, which are coupled by an optical fiber. The photoelectric sensor is applied to detection of a liquid spill (liquid leakage) around a tank that stores volatile liquid. The detection head has a detection surface and projects light toward the detection surface. When the detection surface is wet by a liquid spill, the light is transmitted through the detection surface and cannot be received. Therefore, a light reception amount decreases. Consequently, the liquid spill can be detected. The photoelectric sensor includes a light dividing unit that divides a part of the light upward halfway in inducing the light toward the detection surface in the detection head and includes a display unit that makes it possible to visually recognize the divided light from above the detection head.

The controller includes a red light source and a yellow light source as light projection elements. The red light source and the yellow light source are disposed to be orthogonal to each other. A half mirror is interposed between the red light source and the yellow light source. For example, the red light source is used during normal operation. When a liquid spill is detected, the red light source is switched to the yellow light source. Consequently, a red color can be visually recognized through the display unit at normal time and a yellow color can be visually recognized through the display unit during the liquid spill.

As a modification, the red and yellow light sources may be lit together at the normal time such that an orange color is visually recognized through the display unit. Further, as a modification, it is proposed to, when an abnormality such as an attachment failure of the sensor, a failure of an electric circuit, deterioration of the light receiving element, or breakage of the optical fiber is detected, change a light emission form of the light projecting element.

SUMMARY OF THE INVENTION

An object of the present invention is to provide, on the basis of a photoelectric sensor of a separation type in which a controller includes a light projecting unit and a light receiving unit coupled through a light propagation member, a photoelectric sensor in which the controller incorporates a display light emission source optically coupled to the light propagation member and causes the display light emission source to emit light to thereby cause a distal end of the light propagation member to emit light. In the photoelectric sensor, application examples of display performed using the display light mission source are expanded.

According to the present invention, the technical subject is achieved by providing a photoelectric sensor including:

a light emitting element configured to project detection light toward a detection region;

a light receiving element configured to receive the detection light reflected from the detection region;

a connecting section for light projection to which a light propagation member for light projection optically coupled to the light emitting element is connected;

a connecting section for light reception to which a light propagation member for light reception optically coupled to the light receiving element is connected;

a signal generating unit configured to compare a light reception signal generated by the light receiving element and a threshold and generate a detection signal indicating a result of the comparison;

an optical light emitting element for indication optically coupled to at least one of the connecting section for light reception and the connecting section for light projection and configured to emit visible light; and a control unit configured to light the optical light emitting element for indication according to a light reception state of the light receiving element on the basis of the light reception signal and light the optical light emitting element for indication on the basis of an instruction from an outside.

The proposal in the past only causes the detection head to emit light in order to learn a state directly related to detection of the photoelectric sensor. That is, the proposal in the past only causes the detection head to emit light in order to learn whether the detection is normal or abnormal and learn a failure, deterioration of the light receiving element, and presence or absence of breakage of the optical fiber that cause detection abnormality and an attachment failure of the sensor that induces the detection abnormality. The present invention is not limited to this and has a characteristic in causing the light propagation member for light reception to emit light in order to display matters related to various functions of the photoelectric sensor utilizing at least the light propagation member for light reception as a second display unit. The instruction from the outside includes an instruction based on an input of a user, an input from an IO terminal, instructions through other photoelectric sensors and a communication unit, and an input from the user via a button provided in the photoelectric sensor.

A preferred embodiment of the present invention is explained in detail below. Action and effects and other objects of the present invention, for example, provision of a photoelectric sensor that includes a display light emitting source incorporated in a controller and does not cause an increase in the size of the photoelectric sensor while expanding application examples of display performed using the display light emission source and provision of a photoelectric sensor that can cause a distal end of a light propagation member on a light reception side to emit light with a sufficient light amount without deteriorating light reception performance will become apparent through the detailed explanation.

DESCRIPTION OF EMBODIMENTS

Figure 27:
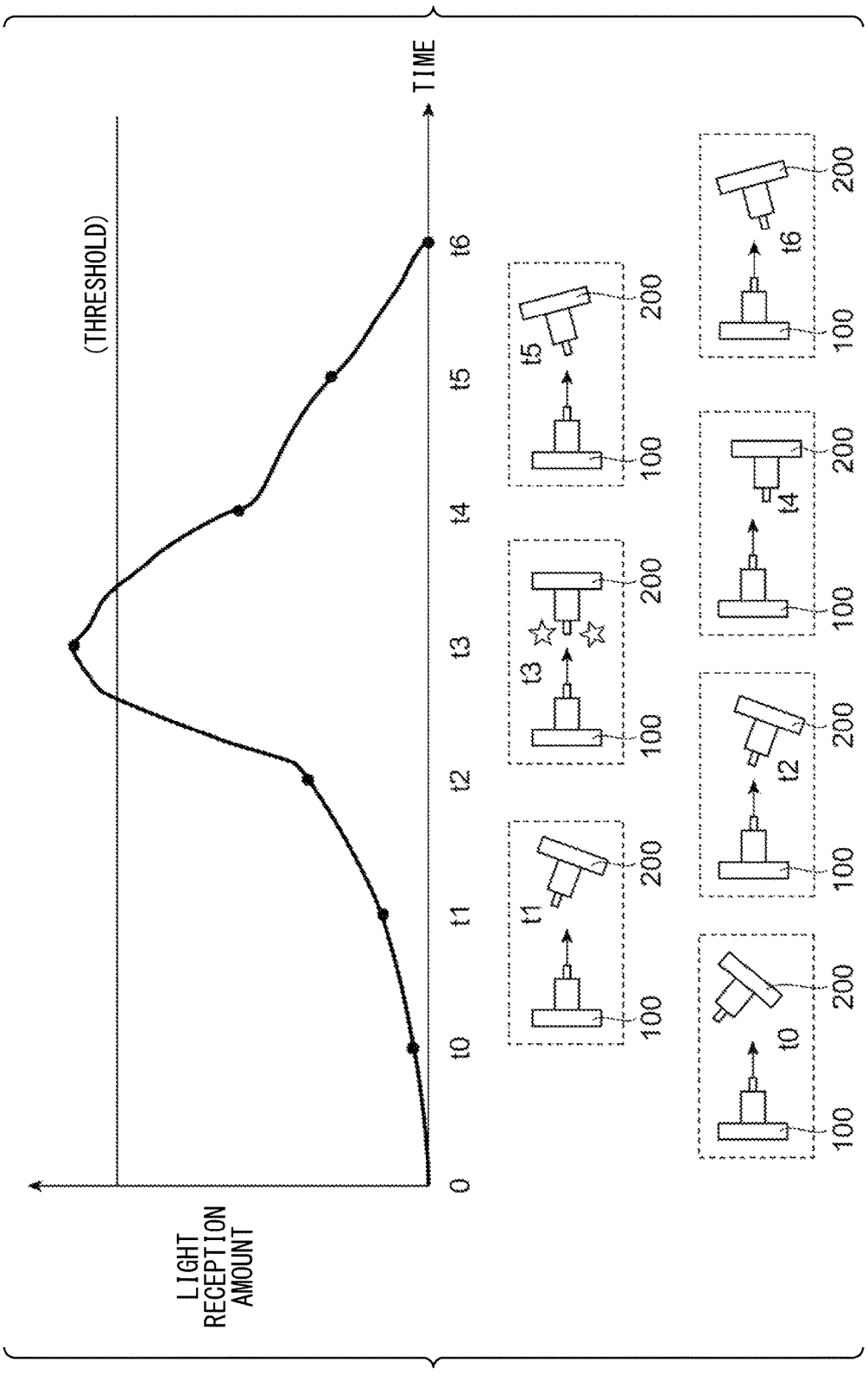
FIG. 27 is a diagram for explaining optical axis adjustment of the light projecting head and the light receiving head.

FIG. 27 is a diagram for explaining relative positioning between a light projecting unit and a light receiving unit in a separation-type photoelectric sensor, that is, optical axis alignment of a light projecting head 100 and a light receiving head 200. In FIG. 27, t0 to t6 indicate elapse of time. Relative positioning of the light projecting head 100 and the light receiving head 200 is performed while moving the heads. In an example shown in FIG. 27, when the time is t3, the optical axis alignment is successfully performed. A light reception amount is the maximum.

A range of X % (e.g., 10%) from the maximum of the light reception amount is set as a light reception amount at which optical axes are aligned. A light reception amount lower than the maximum of the light reception amount by X % is set as a threshold. In a region where a light reception amount is larger than the threshold, the light reception amount is the light reception amount at the time when the optical axes are aligned. When the optical axes are adjusted next time, that is, the relative positioning of the light projecting head 100 and the light receiving head 200 is performed next time, the optical axis adjustment is performed using the threshold.

As clearly described in Patent Literature 2, when the light projecting head 100, the light receiving head 200, and the controller are separated, display of the controller cannot be confirmed. Therefore, the optical axis adjustment of the light projecting head 100 and the light receiving head 200 is difficult.

Referring back to FIG. 27, when the optical axes are aligned, for example, the time is t3, and, for example, the light receiving head 200 emits light, it is possible to learn that the optical axes are aligned by viewing the light. A state of the light emission of the light receiving head 200 is indicated by a star mark in FIG. 27. That is, in the optical axis adjustment, the display of the controller does not have to be confirmed every time. In other words, besides the controller, the light receiving head 200 is caused to emit light. Therefore, the light receiving head 200 also includes substantial display means. The same applies to the light projecting head 100. For example, when both of the light projecting head 100 and the light receiving head 200 emit lights, a pair of the light projecting head 100 and the light receiving head 200 can be visually recognized. This is very effective when a plurality of pairs of the light projecting heads 100 and the light receiving heads 200 are set side by side.

Embodiment

As a preferred embodiment of the present invention, a photoelectric sensor of a transmission type is explained below with reference to the accompanying drawings. However, the present invention is not limited to the photoelectric sensor of the transmission type and can be suitably applied to a photoelectric sensor of a reflection type as well.

FIGS. 1 to 5 are figures concerning a separation-type photoelectric sensor in this embodiment and, more in detail, concerning the photoelectric sensor of the transmission type. A transmission-type photoelectric sensor 1 shown in the figures is a photoelectric sensor of a separation type including a controller 300 (FIG. 3) to which a light projecting head 100 and a light receiving head 200 (FIG. 5) are connected. In the transmission-type photoelectric sensor 1, the light projecting head 100, the light receiving head 200, and the controller 300 are physically separated. The light projecting head 100 and the light receiving head 200 are connected to the controller 300 via an optical fiber Fb (FIG. 3), which is a light propagation member.

Figure 1:
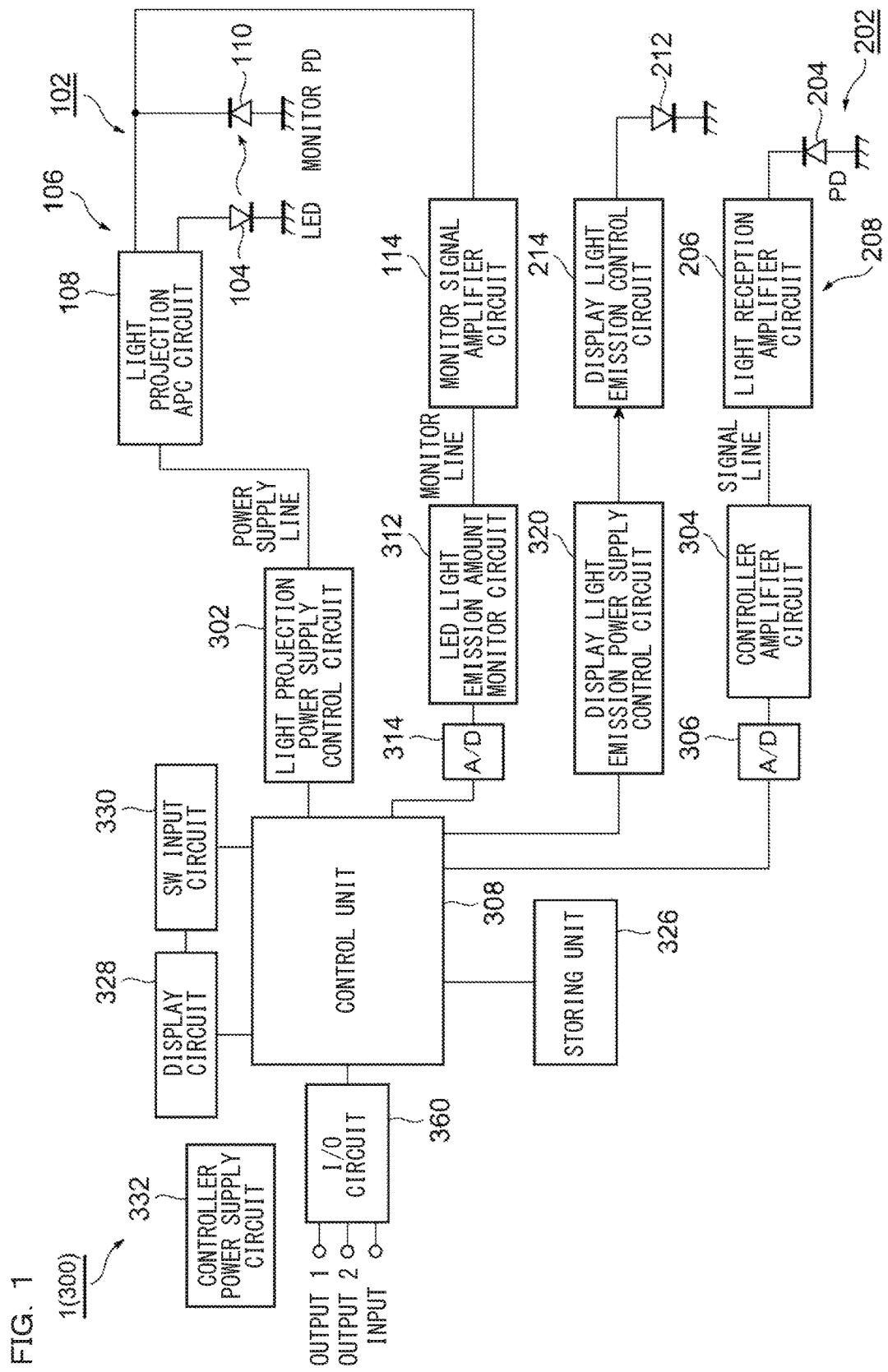
FIG. 1 is a functional block diagram of a photoelectric sensor in an embodiment.

FIG. 1 is a block diagram of the controller 300. A basic configuration of the controller 300 is explained with reference to FIG. 2.

Basic Configuration of the Photoelectric Sensor 1

The photoelectric sensor 1 includes the controller 300 (FIG. 3), the light projecting head 100 (FIG. 5) connected to the controller 300 by the optical fiber Fb, which is a typical light propagation member, and the light receiving head 200 (FIG. 5) connected to the controller 300 by the optical fiber Fb, which is the typical light propagation member.

Referring to FIG. 1, the controller 300 includes a light projecting unit 102 and a light receiving unit 202. The light projecting unit 102 outputs predetermined pulse light to the light projecting head 100. A light emitting element 104 of the light projecting unit 102 is driven by an oscillation pulse supplied from a light projection power supply control circuit 302 to emit pulse light. The light received by the light receiving unit 202 is photoelectrically converted by a light receiving element 204 and sent to a control unit 308 though a light receiving element amplifier circuit 206 and an amplifier circuit 304 and an A/D converter 306 of the controller 300. Consequently, detection synchronizing with the pulse light is applied. A detection signal is further converted into a direct-current signal or the like and thereafter output from an I/O circuit 360, which configures an interface unit, as an ON/OFF signal representing a detection result.

The controller 300 includes the light emitting element 104 for light projection as the light projecting unit 102 and includes a light projection circuit 106 for driving the light emitting element 104. A typical example of the light emitting element 104 is an LED. The light projection circuit 106 includes a light projection APC circuit 108 and a light receiving element for monitor 110 such as a monitor PD. The light projection APC circuit 108 controls an output, that is, a light emission amount of the light emitting element 104 to be a predetermined value.

The light receiving element for monitor 110 of the light projecting unit 102 is connected to a monitor signal amplifier circuit 114. The light receiving element for monitor 110 sends a light reception amount to an LED light emission amount monitor circuit 312 via a monitor line. The LED light emission amount monitor circuit 312 supplies a light reception amount signal converted into a digital signal via an A/D converter 314 to the control unit 308. The control unit 308 controls the light projection power supply control circuit 302 on the basis of a light emission amount detected by the light receiving element for monitor 110 to set the light emission amount to a predetermined value and performs feedback control for adjusting a current amount of the light projection APC circuit 108 and driving the light emitting element 104.

The controller 300 includes a light reception circuit 208 for driving the light receiving element 204. The light receiving element 204 is connected to the light receiving element amplifier circuit 206. As explained above, a light reception amount of light received by the light receiving element 204 is amplified by the light receiving element amplifier circuit 206 and sent to the amplifier circuit 304. An analog signal amplified by the controller amplifier circuit 304 is converted into digital signal via the A/D converter 306 and input to the control unit 308. Consequently, the controller 300 detects the light reception amount of the light receiving element (a photodiode PD) 204, performs determination of the detection on the basis of a predetermined threshold, generates a detection signal indicating a result of the detection, and finally outputs the determination result from the I/O circuit 360.

A storing unit 326 for storing various setting values and the like, a display circuit 328 for displaying information on the controller 300 side, a switch input circuit 330 to which an operation unit 362 (FIG. 2), which is a user interface for receiving setting value adjustment, is connected, the I/O circuit 360 that performs input and output to and from the outside, and the like are connected to the control unit 308. These circuits are driven by a controller power supply circuit 332.

Note that the control unit 308 is configured from an IC such as a CPU, an FPGA, or an ASIC. Various circuits (108, 114, 206, 214, 302, 304, 306, 312, 314, 320, 328, 330, 332, and 360) may be respectively configured from. ICs. The various circuits may be configured by one IC. The control unit 308 and the various circuits may be configured by one IC.

Figure 2:
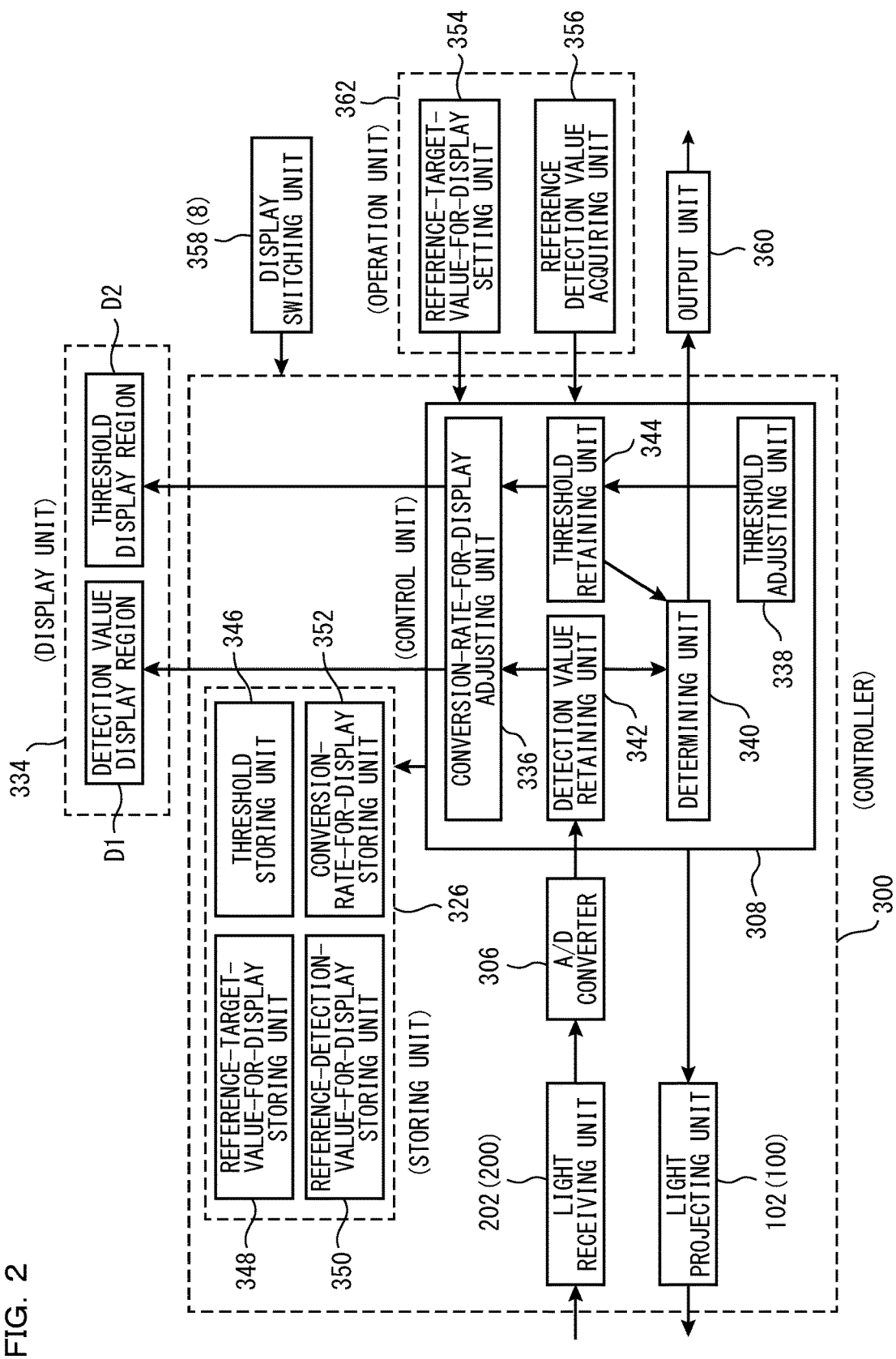
FIG. 2 is a block diagram of a configuration for realizing an adjusting function of a photoelectric switch.

A configuration for realizing an adjusting function of the photoelectric sensor 1 is explained with reference to a block diagram of FIG. 2. The controller 300 includes the control unit 308 for performing the various kinds of control, the storing unit 326 for storing setting values and the like, a display unit 334 for displaying a threshold, a detection value, a target value, and the like, the operation unit 362 for performing various kinds of operation and setting, a display switching unit 358 for switching a display mode in the display unit 334, an output unit 360 for outputting a detection result, and the A/D converter 306 for converting an analog signal of a light reception amount of light received by the light receiving unit 202 into a digital signal. The control unit 308 includes a conversion-rate-for-display adjusting unit 336, a threshold adjusting unit 338, a determining unit 340, a detection value retaining unit 342 that retains a detection value, and a threshold retaining unit 334 that retains a threshold. Further, the storing unit 326 includes a threshold storing unit 346, a reference-target-value-for-display storing unit 348, a reference-detection-value-for-display storing unit 350, and a conversion-rate-for-display storing unit 352. The control unit 308 is configured by a microprocessor such as a CPU. The operation unit 362 of the controller 300 includes a reference-target-value-for-display setting unit 354 and a reference detection value acquiring unit 356.

Figure 5:
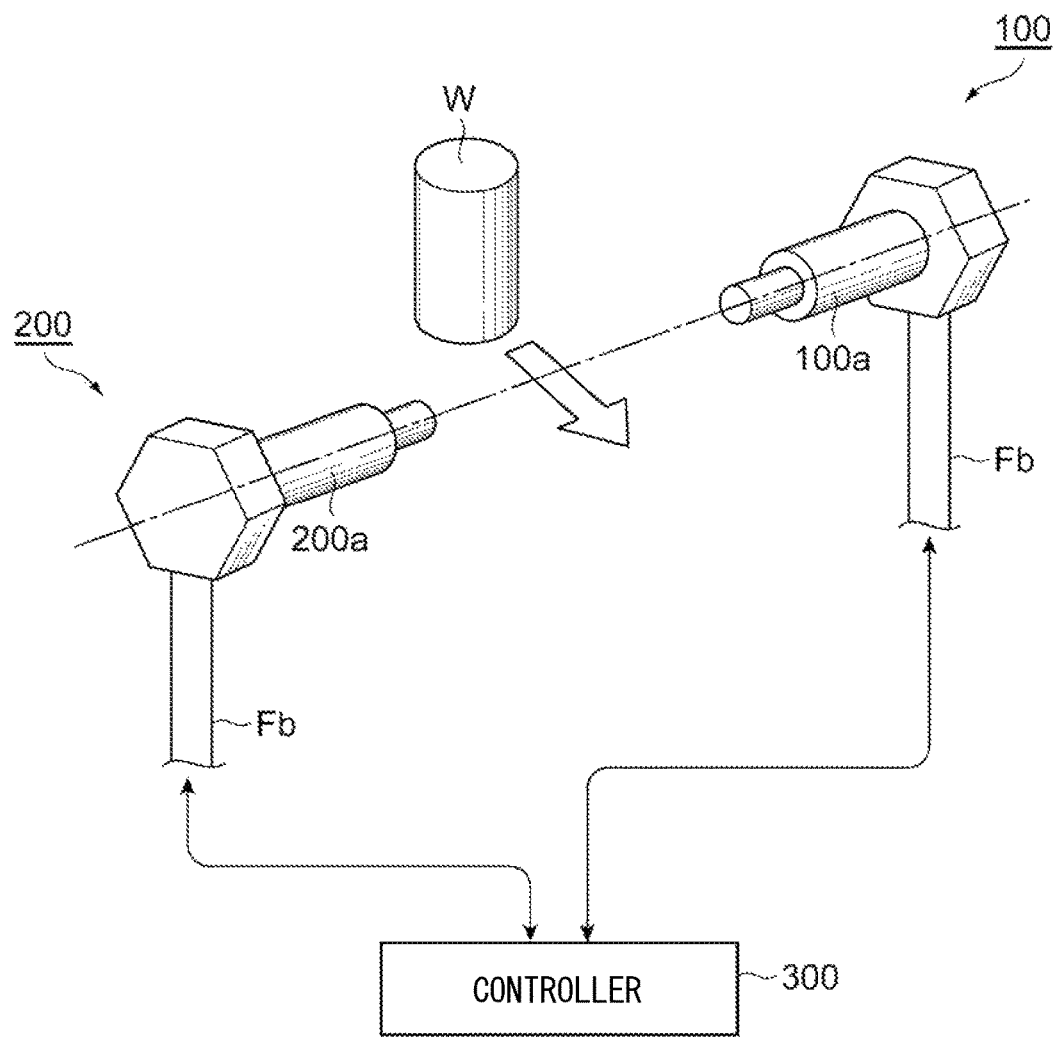
FIG. 5 is a diagram for explaining generation of a detection region between a light projecting head and a light receiving head.

Referring to FIGS. 1 and 5, the photoelectric sensor 1 supplies detection light emitted by the light projecting unit 102 to the light projecting head 100 via the optical fiber Fb. The light projecting head 100 emits light toward a detection region. The photoelectric sensor 1 receives, via the light receiving head 200, light reflected from the detection region. The light is supplied to the light receiving unit 202 via the optical fiber Fb. The determining unit 340 (FIG. 2) compares, as a detection value, a light reception amount of the light received by the light receiving unit 202 with a threshold and outputs a result of the comparison from the output unit 360. Specifically, the determining unit 340 (FIG. 2) compares a digital value of the input detection value with the threshold and outputs a result of the comparison to an external device from the output unit 360 as a binary signal indicating presence or absence of a detection target object.

Figure 3:
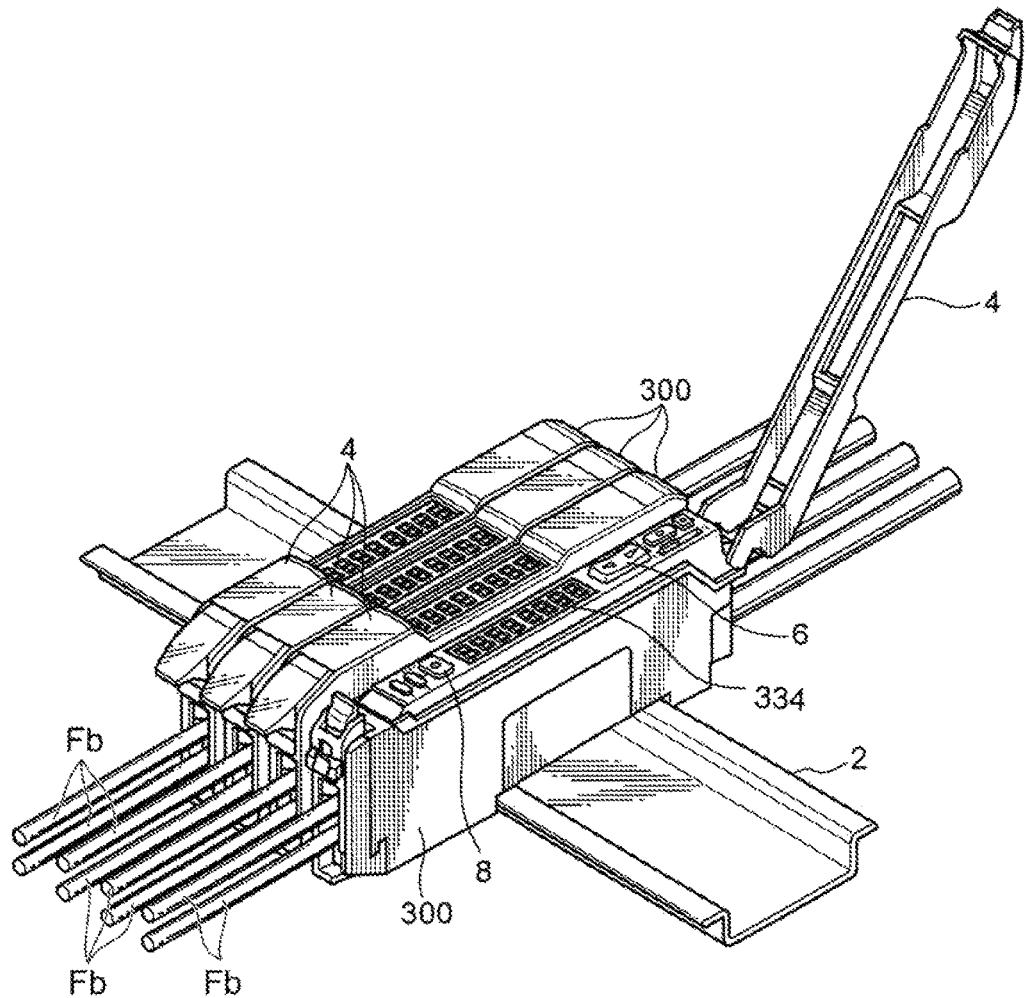
FIG. 3 is a perspective view showing a state in which a plurality of controllers of a photoelectric switch of a separation type are arrayed in lateral arrangement.

FIG. 3 is a perspective view of the controller 300 viewed from obliquely above. In FIG. 3, an example is shown in which four controllers 300 are set adjacent to one another on a DIN rail 2. One controller 300 among the four controllers 300 is shown in a state in which an upper lid 4 is opened.

Among the plurality of controllers 300 set adjacent to one another on the DIN rail 2, one is a master set and the others are slave sets. For example, when light projection of the master set ends, the master set supplies a signal of a light projection start to a first slave set. The first slave set executes light projection. When the light of the first slave set ends, the first slave set supplies a signal of a projection start to a second slave set. The second slave set executes light projection. Thereafter, third and fourth slave sets sequentially start light projection.

Figure 4:
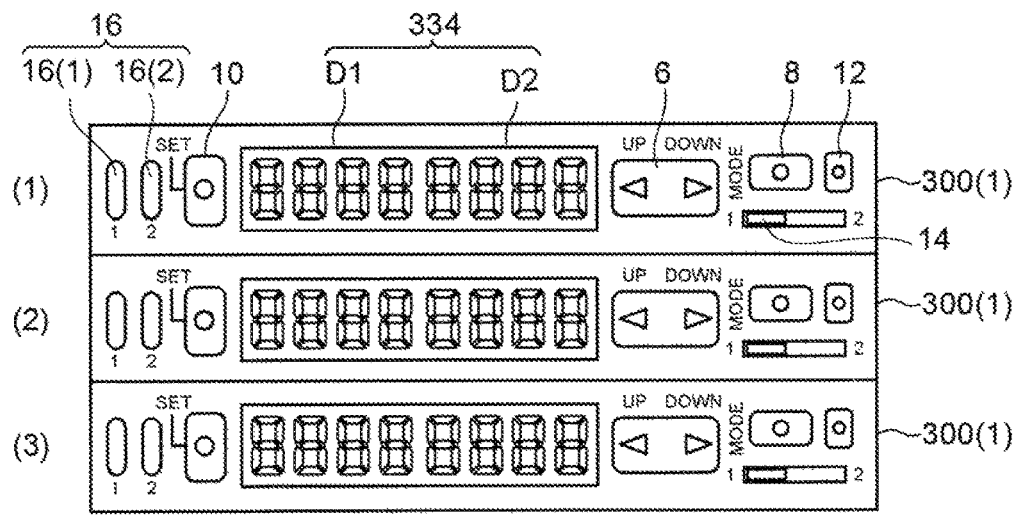
FIG. 4 is a plan view of the plurality of controllers disposed side by side of the separation-type photoelectric switch shown in FIG. 3.

FIG. 4 is a plan view of the photoelectric sensor 1. Referring to FIGS. 3 and 4, the display unit 334 is configured by two four-digit seven-segment displays D1 and D2 disposed side by side. A detection value (a light reception amount), a threshold, and the like are displayed using the two four-digit seven-segment displays D1 and D2. The display unit 334 may be configured by a flat display such as a liquid crystal display.

An up-down button 6 of a swing type, a mode button 8, a set button 10, a preset button 12, and the like are disposed adjacent to the displays D1 and D2.

Continuously referring to FIG. 4, reference numeral 14 denotes a channel changeover switch. The controller 300 has two channels concerning outputs. Reference numeral 16 denotes an operation display lamp for displaying a current output or detection state. Reference sign 16(1) denotes an operation display lamp for a first channel. Reference sign 16(2) denotes an operation display lamp for a second channel. The first and second operation display lamps 16(1) and 16(2) display an output (detection) state from the controller 300 to the outside.

Referring back to FIG. 2, the controller 300 includes the display switching unit 358. The display switching unit 358 is configured by the mode button (M button) 8 and the preset button 12. The preset button 12 is used during preset setting and for various kinds of setting. For example, by operating the mode button 8 and the preset button 12, it is possible to switch a non-conversion display mode for directly displaying the detection value (the light reception amount) and the threshold and a conversion display mode for displaying a detection value for display (a light reception amount for display) and a threshold for display converted at a conversion rate for display or by a conversion formula for display.

The set button 10 is used at the time of sensitivity setting and the like. Sensitivity adjustment means adjusting a setting value. For example, the threshold can be adjusted by operating the set button 10 and the up-down button 6. The up-down button 6 is used for a change of the threshold and other numerical values, determination of a choice, and the like. A display target, a display form, display switching operation, and display mode switching of the controller 300 are described in detail in the specification of JP-A-2006-351380. Therefore, the specification of JP-A-2006-351380 incorporated herein by reference to omit explanation of the display target, the display form, the display switching operation, and the display mode switching of the controller 300.

The transmission-type photoelectric sensor 1 is explained above. However, the structure of a photoelectric sensor of a reflection type is substantially the same. The present invention is not limited to the transmission type and is applicable to the photoelectric sensor of the reflection type as well. As explained above, the present invention is suitably applied to the photoelectric sensor of the fiber type in which the light projecting head 100 the light receiving head 200 and the controller 300 are connected by the optical fiber Fb, which is the light propagation member.

Referring to FIG. 5, the light receiving head 200 includes a light receiving cylinder 200a that receives light projected from the light projecting head 100. The light projecting head 100 includes a light projecting cylinder 100a that emits detection light. The light projecting head 100 projects the detection light toward the detection region. The light receiving head 200 receives light reflected from the detection region. In setting of the light projecting head 100 and the light receiving head 200, relative positioning of the light projecting head 100 and the light receiving head 200 affects the performance of the photoelectric sensor 1. The positioning is performed by causing the light projecting cylinder 100a and the light receiving cylinder 200a of the light receiving head 200 to face each other and aligning the axis of the light projecting cylinder 100a and the axis of the light receiving cylinder 200a. By properly setting the light projecting head 200 and the light receiving head 200, it is possible to properly detect "presence" and "absence" of work W according to presence or absence of light blocking involved in passage of the work W between the light receiving head 200 and the light projecting head 100.

Display Light Emitting Mechanism

Referring to FIG. 1, the light receiving unit 202 includes an optical light emitting element for indication 212 functioning as a light emission source of visible light. The optical light emitting element for indication 212 is typically configured by an LED. For example, when the light emitting element 104 is configured by a red LED, the optical light emitting element for indication 212 is desirably configured by a green LED. Lighting of the optical light emitting element for indication 212 is controlled by the display light emission control circuit 214. Driving electric power is supplied to the display light emission control circuit 214 by a display light emission power supply control circuit 320.

A switch for, for example, forcibly stopping a lighting function of the optical light emitting element for indication 212 may be provided. By turning off the switch, lighting control of the optical light emitting element for indication 212 is stopped. Naturally, by turning on the switch, the lighting control of the optical light emitting element for indication 212 is executed. Naturally, by the switch, a state unrelated to detecting operation (a light reception amount) of the controller 300 may be continued, for example, a lighting state of the optical light emitting element for indication 212 is maintained in, for example, an extinguished state or maintained in a lighting state at a predetermined frequency.

A first mode for changing the lighting state of the optical light emitting element for indication 212 on the basis of a light reception amount involved in detection and a second mode for maintaining the lighting state of the optical light emitting element for indication 212 irrespective of the light reception amount may be prepared. The first and second modes may be able to switched by, for example, simultaneously pressing the mode button (M button) 8 and the preset button 12. As the mode switching, it is desirable that the first mode can be switched to the second mode after optical axis alignment.

Concerning the lighting of the optical light emitting element for indication 212 in the second mode, it is desirable that (1) the optical light emitting element for indication 212 is lit on the basis of an instruction from the outside or (2) the optical light emitting element for indication 212 is lit on the basis of a state of an element other than the light receiving element 204 inside the controller 300.

The display by the optical light emitting element for indication 212 may be associated with the display of the controller 300, that is, display of the display lamps 16(1) and 16(2) (FIG. 4). The display by the optical light emitting element for indication 212 and the display of the controller 300 can be switched to be associated and not associated according to an input to the controller 300. The controller 300 is connected to a patrol lamp (a warming lamp) via an output line and via an external PLC or not via the PLC. The controller 300 may be associated with an output state of a sensor by the warming lamp.

The display by the optical light emitting element for indication 212 may be performed when abnormality inside the controller 300 occurs. For example, when abnormality occurs in the light emitting element 104 of the light projecting unit 102, the optical light emitting element for indication 212 may be lit to inform that the abnormality occurs on the inside of the controller 300.

Hardware Configuration of the Controller 300 (FIGS. 6 to 9)

Figure 6:
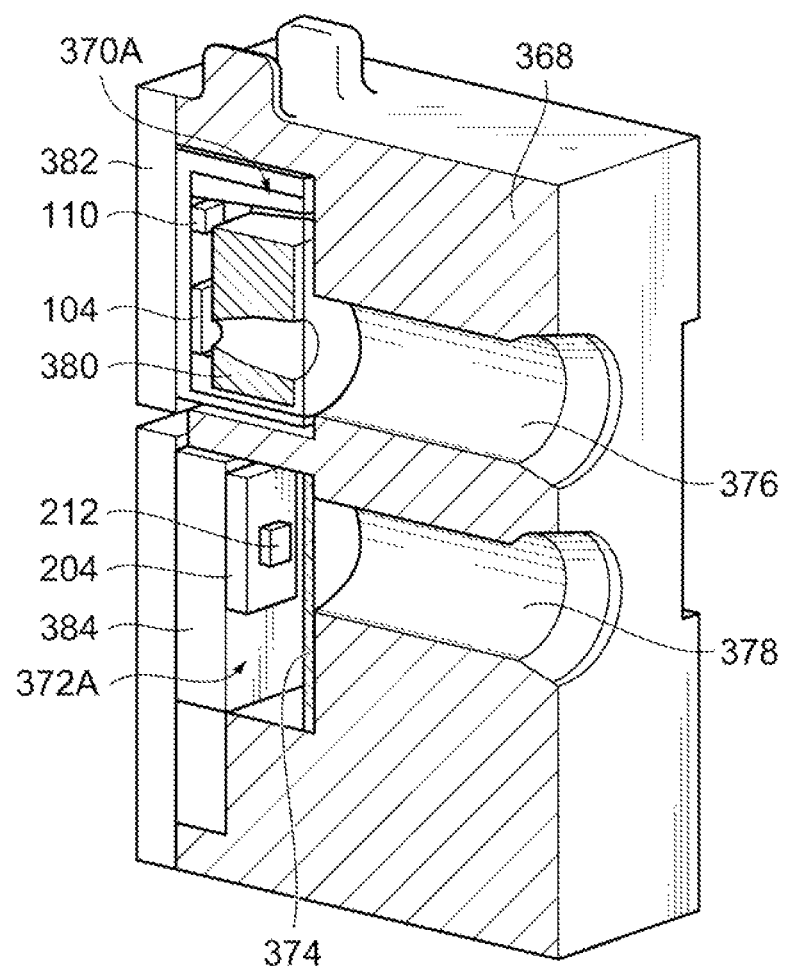
FIG. 6 is a longitudinal sectional perspective view of a controller for explaining a light projecting unit, a light receiving unit, and a structure related to the light projecting unit and the light receiving unit included in a first application example.

Referring to FIG. 6, the controller 300 includes an element holder 368. A light projecting member 370 and a light receiving member 372 are housed in the element holder 368. The light projecting member 370 substantially configures the light projecting unit 102. The light receiving member 372 substantially configures the light receiving unit 202. The element holder 368 includes a first insertion hole 376 that receives the optical fiber Fb, which is the light propagation member, between the controller 300 and the light projecting head 100 and a second insertion hole 378 that receives the optical fiber Fb, which is the light propagation member, between the controller 300 and the light receiving head 200. The first insertion hole 376 configures a connecting section for light projection that connects an optical fiber for light projection. The second insertion hole 378 configures a connecting section for light reception that connects an optical fiber for light reception. The distal end portions of the optical fibers Fb are deeply fit in the first and second insertion holes 376 and 378.

Figure 7:
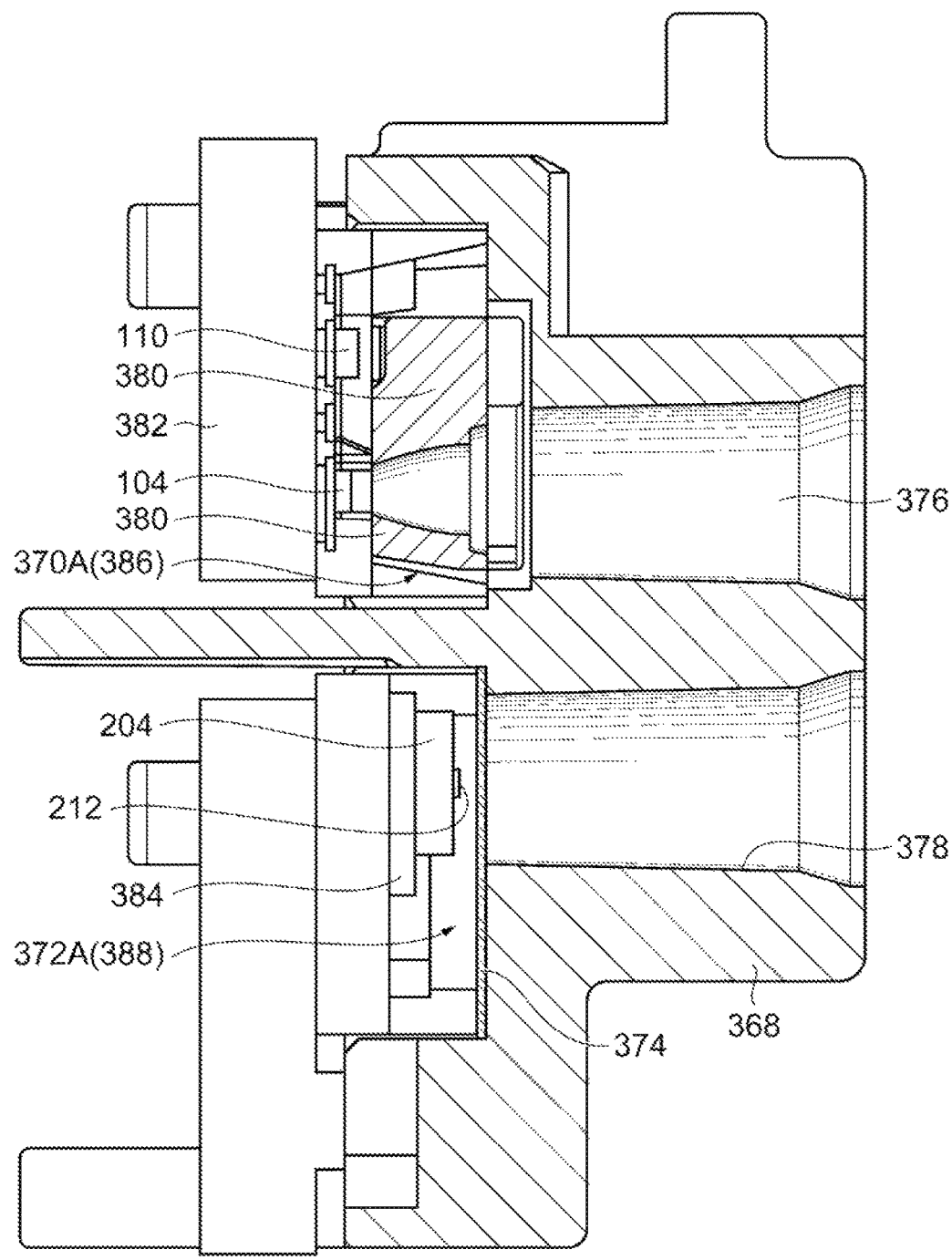
FIG. 7 is a longitudinal sectional view of the controller for explaining the light projecting unit, the light receiving unit, and the structure related to the light projecting unit and the light receiving unit included in the first application example.

Referring to FIG. 6 and FIG. 7, which is a longitudinal sectional view of the controller 300, the light projecting member 370 includes an LED as the light emitting element 104 and includes the light receiving element for monitor 110 such as the monitor PD and a reflector 380. The light receiving element for monitor 110 detects a light emission amount of the light emitting element 104. Feedback control of the light emitting element 104 is performed to set the detected light emission amount to a predetermined value.

The light receiving member 372 includes the light receiving element 204 configured by the photodiode PD and the LED 212 functioning as the optical light emitting element for indication. The display light emitting LED 212 is disposed on the light receiving element 204. That is, the light receiving element 204 includes a main light receiving surface of the light receiving element 204, that is, a light receiving surface facing the second insertion hole 378 (the optical fiber Fb for light reception). The display light emitting LED 212 is disposed on the main light receiving surface of the light receiving element 204. In FIG. 7, reference numeral 382 denotes amounting substrate for light projection and reference numeral 384 denotes amounting substrate for light reception.

Figure 8:
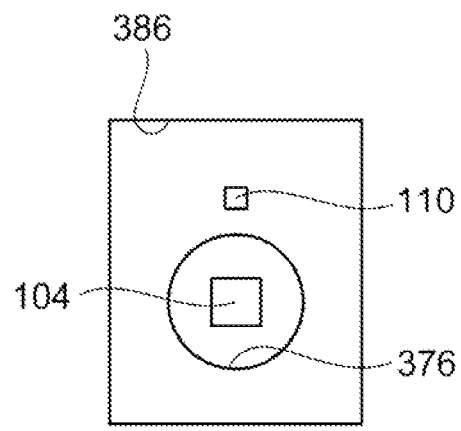
FIG. 8 is a diagram for explaining a relation between a hole that receives an optical fiber for light projection and a light projection side space in relation to FIGS. 6 and 7.
Figure 9:
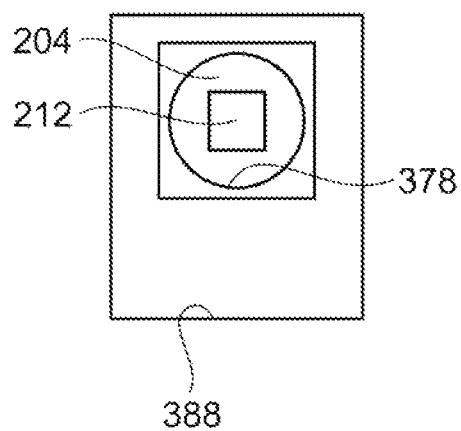
FIG. 9 is a diagram for explaining a relation between a hole that receives an optical fiber for light reception and a light reception side space in relation to FIGS. 6 and 7.

Reference numeral 386 in FIG. 7 denotes a light projection side space in which a light projecting member 370A (FIG. 6) included in a first application example is set. Reference numeral 388 denotes a light reception side space in which a light receiving member 372A (FIG. 6) is set. The light projection side space 386 and the light reception side space 388 are optically isolated. Referring to FIG. 8 for explaining relative positions of the light projection side space 386 and the first insertion hole 376 (a hole that receives the optical fiber Fb for light projection), the light emitting element 104 is positioned such that the center of the light emitting element 104 coincides with the axis of the first insertion hole 376. Referring to FIG. 9 for explaining relative positions of the light reception side space 388 and the second insertion hole 378 (a hole that receives the optical fiber Fb for light reception), the light receiving element 204 is positioned such that the center of the light receiving element 204 coincides with the axis of the second insertion hole 378.

Referring to FIGS. 6 and 7, the light receiving element 204 is disposed on the mounting substrate for light reception 384. The optical light emitting element for indication 212 is disposed on the light receiving element 204. The light receiving element 204 and the optical light emitting element for indication 212 are positioned to be substantially coaxial with the insertion end of the optical fiber Fb for light reception. Therefore, the light receiving element 204 is disposed in a position far from the insertion end of the optical fiber Fb for light reception compared with the optical light emitting element for indication 212. In other words, the optical light emitting element for indication 212 is disposed in a position close to the insertion end of the optical fiber Fb for light reception compared with the light receiving element 204. A glass plate 374, which is a light transmitting member, is interposed between the second insertion hole 378, which receives the optical fiber Fb for light reception, and the light reception side space 388. A regular insertion assembly position of the optical fiber Fb for light reception is a position where the insertion end of the optical fiber Fb for light reception is in contact with the glass plate 374.

Figure 10:
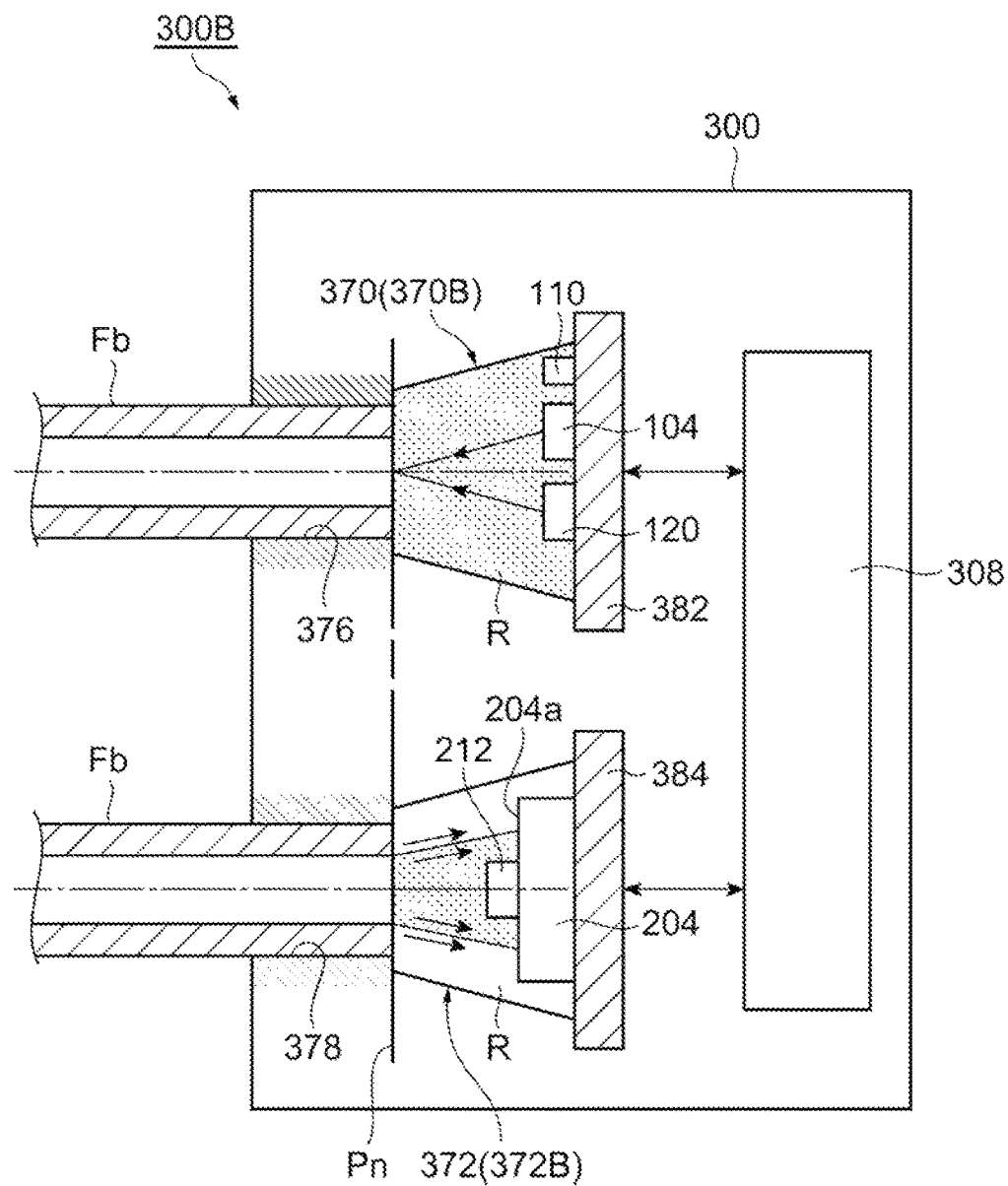
FIG. 10 is a diagram for explaining the structure of a light receiving member and a light projecting member included in a second application example.

FIG. 10 is a diagram for explaining a light receiving member 372B and a light projecting member 370B included in a second application example. The light receiving member 372B shown in FIG. 10 is a modification of the light receiving member 372A shown in FIG. 6.

The light receiving member 372B includes the light receiving element 204 configured by a photodiode bare chip and includes, as a light emission source, the optical light emitting element for indication 212 configured by an LED bare chip. The photodiode bare chip is mounted on the mounting substrate for light reception 384.

That is, by positioning the mounting substrate for light reception 384, the photodiode bare chip configuring the light receiving element 204 is positioned in a state in which the photodiode bare chip is centered on the axis of the insertion end of the optical fiber Fb for light reception. The light receiving element 204 is mounted on the mounting substrate for light reception 384. Naturally, a light receiving surface 204a is positioned in a state in which the light receiving surface 204a faces the optical fiber Fb for light reception. The optical light emitting element for indication 212 is mounted on the light receiving surface 204a directed to the optical fiber Fb for light reception. Further, the optical light emitting element for indication 212 and the light receiving element 204 are surrounded by common transparent mold resin R having a trapezoidal shape in section. That is, the photodiode bare chip (the light receiving element 204) is disposed on the mounting substrate for light reception 384 side. The LED bare chip (the optical light emitting element for indication 212) is disposed on the insertion end side of the optical fiber Fb for light reception. The photodiode bare chip and the LED bare chip are surrounded by the common transparent mold resin R. The mold resin R is desirably surrounded by a material that reflects light. For example, metal is vapor-deposited on the outer surface of the mold resin R. The insertion end of the optical fiber Fb for light reception is fixed to the second insertion hole 378 in a state in which the insertion end is in contact with the mold resin R. A regular insertion assembly position of the optical fiber Fb for light reception inserted into the second insertion hole 378 is a position where the insertion end of the optical fiber Fb for light reception is in contact with the mold resin R.

As it is seen from FIG. 10, the light receiving surface 204a of the photodiode bare chip of the light receiving element 204 is larger than the LED bare chip of the optical light emitting element for indication 212.

The optical light emitting element for indication 212 mounted on the light receiving element 204 is positioned in a state in which the optical light emitting element for indication 212 is separated from the insertion end of the optical fiber Fb for light reception by the transparent mold resin R. In FIG. 10, arrows indicate detection light entering the light receiving member 372B from the optical fiber Fb for light reception. The detection light enters the light receiving member 372B in a state of a spread fan from the insertion end of the optical fiber Fb for light reception. A light receiving area is indicated by dots. The detection light is received in a portion excluding a portion occupied by the optical light emitting element for indication 212 on the light receiving surface 204a of the light receiving element 204. That is, the area occupied by the optical light emitting element for indication 212 is considerably small compared with the area of the light receiving surface 204a of the light receiving element 204. The optical light emitting element for indication 212 is positioned in the center portion of the light receiving surface 204a. The light receiving element 204 can receive light in the outer circumferential portion of the center portion.

The optical light emitting element for indication 212 placed on the light receiving element 204 is positioned in a state in which the optical light emitting element for indication 212 is close to the insertion end of the optical fiber Fb. Therefore, even if a light amount of the optical light emitting element for indication 212 is relatively small, since an amount of light entering the optical fiber Fb is large, it is possible to intensely emit light at the distal end of the optical fiber Fb, that is, in the light receiving head 200. In other words, if a degree of light emission in the light receiving head 200 is the same, an amount of light emitted by the optical light emitting element for indication 212 may be smaller as the optical light emitting element for indication 212 is set closer to the insertion end of the optical fiber Fb.

The controller 300 may include, as the light projecting member 370B, an optical light emitting element for indication 120 functioning as a light emission source in addition to the LED functioning as the light emitting element 104 and the light receiving element for monitor 110 such as the monitor PD. The light emitting element 104, the light receiving element for monitor 110, and the optical light emitting element for indication 120 are mounted on the mounting substrate for light projection 382 positioned in lateral arrangement in the controller 300. As explained above, the light receiving element for monitor 110 detects a light emission amount of the light emitting element 104. The detected light emission amount is used to perform feedback control of the light emitting element 104 to set the detected light emission amount to a predetermined value.

As it is seen well from FIG. 10, the light receiving element for monitor 110 is disposed in a position away from the light receiving member 372B most or as much as possible. That is, the light receiving element for monitor 110 is disposed on the opposite side of the light receiving member 372B.

The optical light emitting element for indication 120 is typically configured by an LED. The LED may be an LED having the same color as the LED of the light emitting element 104. However, the LED is desirably an LED having a different color. Specifically, if the LED of the light emitting element 104 is red, the LED of the optical light emitting element for indication 120 is desirably green.

A color of the optical light emitting element for indication 120 included in the light projecting member 370B may be the same as or may be different from a color of the optical light emitting element for indication 212 included in the light receiving member 372B. By adopting the different colors, it is easy to distinguish the light projecting head 100 and the light receiving head 200.

The LED of the light emitting element 104 is configured by a bare chip. The LED of the optical light emitting element for indication 120 is also configured by a bare chip. The LED bare chip configuring the light emitting element 104 and the LED bare chip configuring the optical light emitting element for indication 120 are positioned to be disposed side by side with respect to the insertion end of the optical fiber Fb for light projection. The light emitting element 104 and the optical light emitting element for indication 120 are surrounded by the common transparent mold resin R having the trapezoidal shape in section. The insertion end of the optical fiber Fb for light projection is fixed to the first insertion hole 376 in a state in which the insertion end is in contact with the mold resin R. That is, a regular insertion assembly position of the optical fiber Fb for light projection is a position where the insertion end of the optical fiber Fb for light projection is in contact with the mold resin R.

Figure 11:
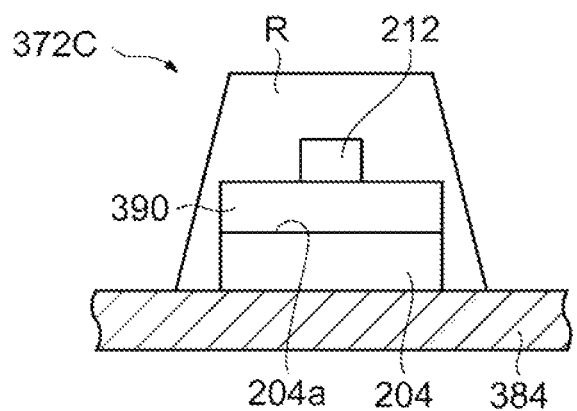
FIG. 11 is a diagram for explaining a light receiving member included in a third application example.

FIG. 11 is a diagram for explaining a light receiving member 372C included in a third application example. The light receiving member 372C shown in FIG. 11 is a modification of the light receiving member 372B shown in FIG. 10. The light receiving member 372C shown in FIG. 11 has a three-layer structure. That is, the light receiving member 372C includes the light receiving element 204 configured by the photodiode bare chip. The light receiving element 204 is mounted on the mounting substrate for light reception 384.

A filter member 390 having a wavelength-selective light absorbing ability is mounted between the light receiving element 204 and the optical light emitting element for indication 212 configured by the LED bare chip located above the light receiving element 204. The filter member 390 may have the same area as the light receiving surface 204a of the light receiving element 204 or may have size limited to a part in contact with the optical light emitting element for indication 212 and the periphery of the part. The filter member 390 may have an area larger than the light receiving surface 204a. The filter member 390 has thickness compared with a coating film and is configured by color glass such as red glass or a color-coated transparent member. With the filter member 390, it is possible to reduce a degree of an adverse effect on the light receiving element 204 by light emitted by the optical light emitting element for indication 212. That is, the filter member 390 such as the color glass or the color-coated transparent member configures means for reducing an amount of visible light (display light), which is emitted by the optical light emitting element for indication 212, entering the light receiving element 204.

The light receiving element 204, the filter member 390, and the optical light emitting element for indication 212 are surrounded by the common transparent mold resin R having the trapezoidal shape in section. The shape of the mold resin R may be a bullet type explained with reference to FIG. 13 and the like. The insertion end of the optical fiber Fb for light reception is fixed to the second insertion hole 378 in a state in which the insertion end is in contact with the mold resin R. That is, a regular insertion assembly position of the optical fiber Fb for light reception is a position where the insertion end of the optical fiber Fb is in contact with the mold resin R.

As a modification of the light receiving member 372C shown in FIG. 11, instead of the common mold resin R, as explained with reference to FIG. 6, the glass plate 374, which is the light transmitting member, may be interposed between the second insertion hole 378, which receives the optical fiber Fb for light reception, and the light reception side space 388.

Figure 12:
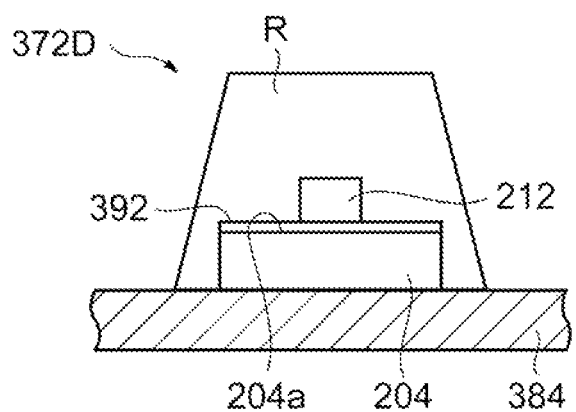
FIG. 12 is a diagram for explaining a light receiving member included in a fourth application example.

FIG. 12 is a diagram for explaining a light receiving member 372D included in a fourth application example. The light receiving member 372D included in the fourth application example is a modification of the light receiving member 372C shown in FIG. 11. The light receiving member 372D includes a thin film 392 such as a film or color coating having a wavelength-selective light absorbing ability or light reflecting ability instead of the filter member 390 having the thickness. The thin film 392 may be disposed over the entire region of the light receiving surface 204a of the light receiving element 204 or may be disposed limitedly in a part in contact with the optical light emitting element for indication 212 and the periphery of the part.

As in the light receiving member 372C shown in FIG. 11, as a modification of the light receiving member 372D shown in FIG. 12, instead of the common mold resin R, as explained with reference to FIG. 6, the glass plate 374, which is the light transmitting member, may be interposed between the second insertion hole 378, which receives the optical fiber Fb for light reception, and the light reception side space 388.

Figure 13:
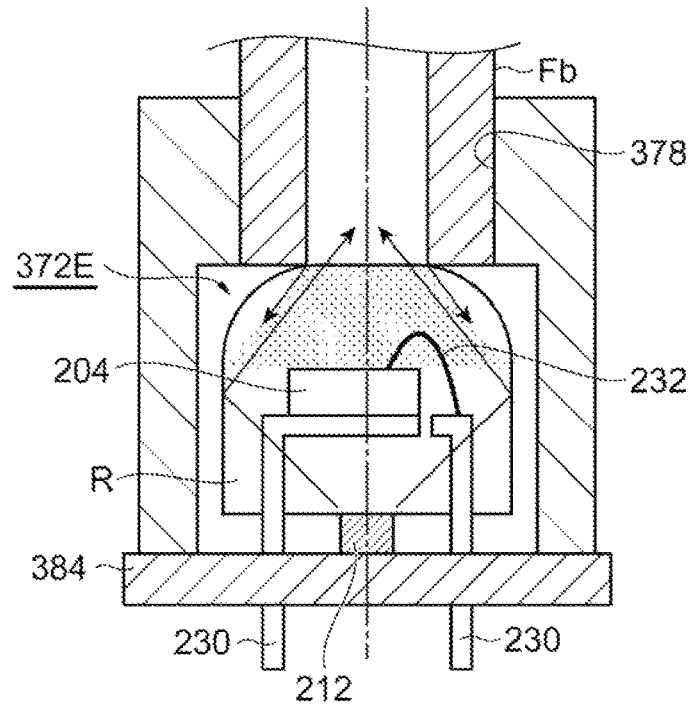
FIG. 13 is a diagram for explaining a light receiving member included in a fifth application example.

FIG. 13 is a diagram for explaining a light receiving member 372E included in a fifth application example. The light receiving member 372E shown in FIG. 13 includes the optical light emitting element for indication 212 mounted on the mounting substrate for light reception 384 and configured by the LED chip and includes the light receiving element 204 positioned at an interval above the optical light emitting element for indication 212 by a lead frame 230. The light receiving element 204 is configured by a photodiode bare chip. The light receiving element 204 and the optical light emitting element for indication 212 are positioned to be substantially coaxial with the insertion end of the optical fiber Fb for light reception. In FIG. 13, reference numeral 232 denotes a wire. The lead frame 230 and the light receiving element 204 are surrounded by the molded transparent mold resin R of the bullet type. The insertion end of the optical fiber Fb for light reception is fixed to the second insertion hole 378 in a state in which the insertion end is in contact with the mold resin R of the bullet type. That is, a regular insertion assembly position of the optical fiber Fb for light reception is a position where the insertion end of the optical fiber Fb for light reception is in contact with the mold resin R of the bullet type.

The optical light emitting element for indication 212 configured by the LED chip is desirably bonded to the bottom surface of the mold resin R of the bullet type by an adhesive. Naturally, the adhesive is desirably formed by a light transmissive material.

Light emitted by the optical light emitting element for indication 212 is induced into the optical fiber Fb for light reception through the mold resin R of the bullet type.

With the light receiving member 372E shown in FIG. 13, it is possible not only to dispose the light receiving element 204 in a state in which the light receiving element 204 is close to the insertion end of the optical fiber Fb for light reception compared with the optical light emitting element for indication 212 but also to dispose the light receiving element 204 in a position as close as possible to the insertion end of the optical fiber Fb for light reception. Therefore, it is possible to secure high light reception performance of the light receiving element 204.

A light blocking member or a reflecting member may be disposed by, for example, being applied to the lower surface and the side surface of the light receiving element 204. The mold resin R of the bullet type is desirably surrounded by a material that reflects light. For example, metal is vapor-deposited on the outer surface of the mold resin R of the bullet type.

Figure 14:
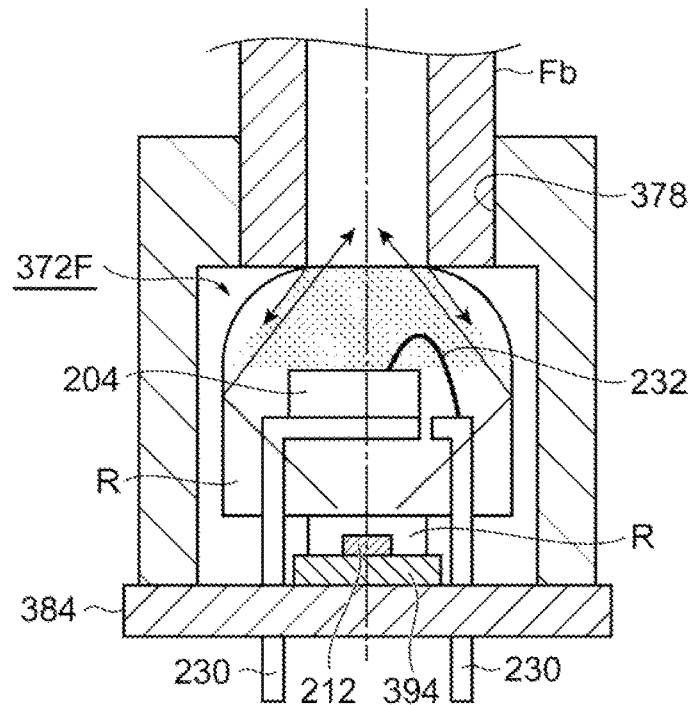
FIG. 14 is a diagram for explaining a light receiving member included in a sixth application example.

FIG. 14 is a diagram for explaining a light receiving member 372F included in a sixth application example. The light receiving member 372F shown in FIG. 14 is a modification of the light receiving member 372E shown in FIG. 13. In the light receiving member 372E shown in FIG. 13, the optical light emitting element for indication 212 configured by the LED chip is mounted on the mounting substrate for light reception 384. However, in the light receiving member 372F shown in FIG. 14, a heat radiation plate 394 is interposed between the optical light emitting element for indication 212 and the mounting substrate 384. The optical light emitting element for indication 212 configured by the LED chip may be surrounded by the resin mold R.

Figure 15:
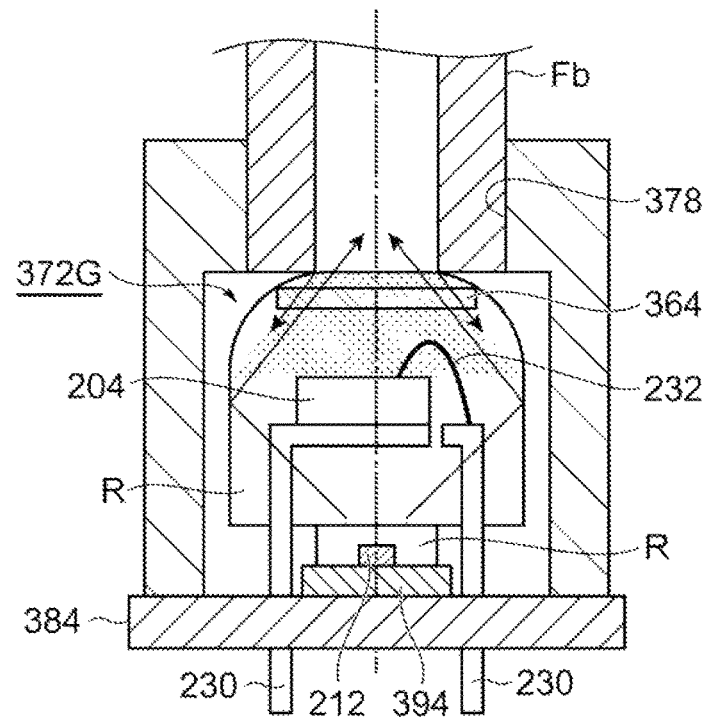
FIG. 15 is a diagram for explaining a light receiving member included in a seventh application example.

FIG. 15 is a diagram for explaining a light receiving member 372G included in a seventh application example. The light receiving member 372G shown in FIG. 15 is a modification of the light receiving member 372E shown in FIG. 13 or a modification of the light receiving member 372F shown in FIG. 14. In the light receiving members 372E and 372F shown in FIGS. 13 and 14, the light receiving element 204 positioned above the optical light emitting element for indication 212 is surrounded by the resin mold R of the bullet type. However, in the light receiving member 372G shown in FIG. 15, a disturbance light removal filter 364 is disposed above the optical light emitting element for indication 212. The disturbance light removal filter 364 is surrounded by the resin mold R common to the optical light emitting element for indication 212. The light receiving member 372G shown in FIG. 15 is drawn as a modification of the light receiving member 372F shown in FIG. 14. However, the disturbance light removal filter 364 may be added to the light receiving member 372E shown in FIG. 13.

Since the disturbance light removal filter 364 is interposed between the insertion end of the optical fiber Fb for light reception and the light receiving element 204, it is possible to reduce the influence of disturbance light on the light receiving element 204.

Figure 16:
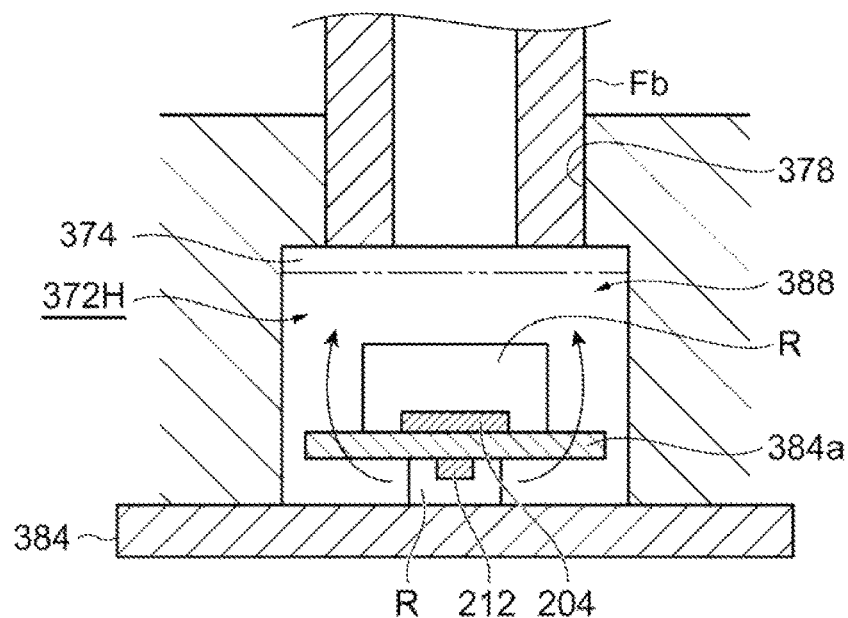
FIG. 16 is a diagram for explaining a light receiving member included in an eighth application example.

FIG. 16 is a diagram for explaining a light receiving member 372H included in an eighth application example. The light receiving member 372H shown in FIG. 16 includes an additional mounting substrate 384a above the mounting substrate for light reception 384. The optical light emitting element for indication 212 configured by the LED bare chip is mounted on a surface on one side of the additional mounting substrate 384a, that is, a surface on a side facing the mounting substrate for light reception 384.

A photodiode bare chip is mounted on a surface on the other side of the additional mounting substrate 384a, that is, a surface on a side facing the insertion end of the optical fiber Fb for light reception. The photodiode bare chip configures the light receiving element 204. Both of the LED bare chip 212 and the photodiode bare chip 204 mounted on the additional mounting substrate 384a are desirably surrounded by the mold resin R. As a modification, the photodiode bare chip 204 on the additional mounting substrate 384a may be surrounded by the mold resin R of the bullet type.

The glass plate 374, which is a light transmitting member, is interposed between the second insertion hole 378, which receives the optical fiber Fb for light reception, and the light reception side space 388. A regular insertion assembly position of the optical fiber Fb for light reception is a position where the insertion end of the optical fiber Fb for light reception is in contact with the glass plate 374.

Figure 17:
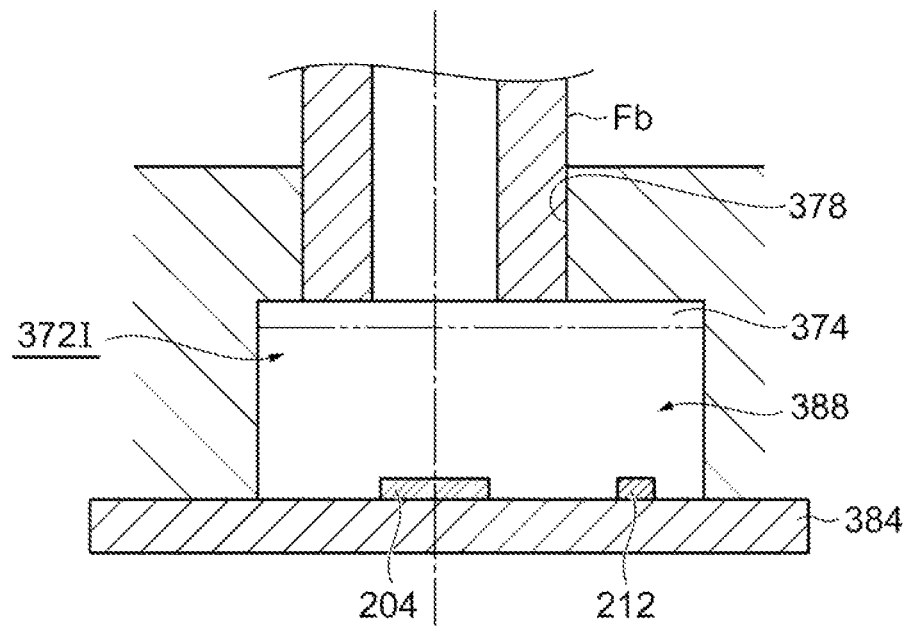
FIG. 17 is a diagram for explaining a light receiving member included in a ninth application example.

FIG. 17 is a diagram for explaining a light receiving member 372I included in a ninth application example. The light receiving member 372I shown in FIG. 17 is mounted on the mounting substrate for light reception 384 in a state in which the light receiving element 204 configured by the photodiode bare chip and the optical light emitting element for indication 212 configured by the LED bare chip are positioned side by side. The light receiving element 204 is positioned such that the center of the light receiving element 204 coincides with the axis of the second insertion hole 378.

The glass plate 374, which is the light transmitting member, is interposed between the second insertion hole 378, which receives the optical fiber Fb for light reception, and the light reception side space 388. A regular insertion assembly position of the optical fiber Fb for light reception is a position where the insertion end of the optical fiber Fb for light reception is in contact with the glass plate 374. Light of the optical light emitting element for indication 212 is received by the fiber Fb for light reception through the glass plate (the light transmitting member) 374 common to the light receiving element 204.

Figure 18:
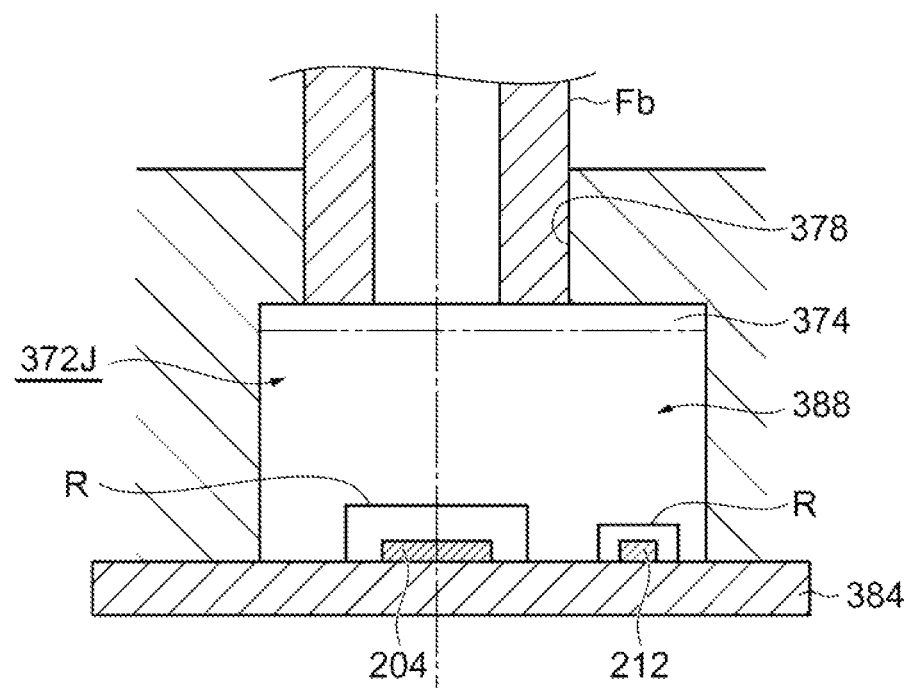
FIG. 18 is a diagram for explaining a light receiving member included in a tenth application example.

FIG. 18 is a diagram for explaining a light receiving member 372J included in a tenth application example. The light receiving member 372J shown in FIG. 18 is a modification of the light receiving member 372I shown in FIG. 17. In the light receiving member 372I shown in FIG. 17, the light receiving element 204 is configured by the photodiode bare chip and the optical light emitting element for indication 212 is configured by the LED bare chip. However, in the light receiving member 372J shown in FIG. 18, the light receiving element 204 is configured by the photodiode bare chip surrounded by the mold resin R and the optical light emitting element for indication 212 is configured by the LED bare chip surrounded by the mold resin R. Naturally, at least one of the photodiode bare chip and the LED bare chip may be surrounded by the mold resin R.

Figure 19:
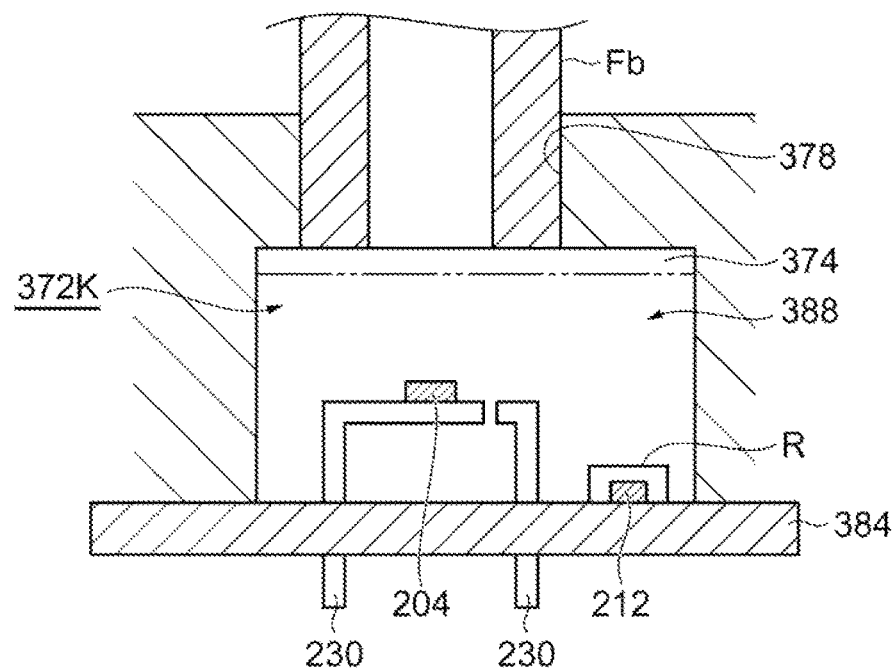
FIG. 19 is a diagram for explaining a light receiving member included in an eleventh application example.

FIG. 19 is a diagram for explaining a light receiving member 372K included in an eleventh application example. The light receiving member 372K shown in FIG. 19 is a modification of the light receiving member 372J shown in FIG. 18. In the light receiving member 372J shown in FIG. 18, the light receiving element 204 configured by the photodiode bare chip is mounted on the mounting substrate for light reception 384. However, in the light receiving member 372K shown in FIG. 19, the photodiode bare chip is separated upward from the mounting substrate 384 and positioned by the lead frame 230. Consequently, the light receiving element 204 can be disposed in a state in which the light receiving element 204 is close to the optical fiber Fb for light reception.

Figure 20:
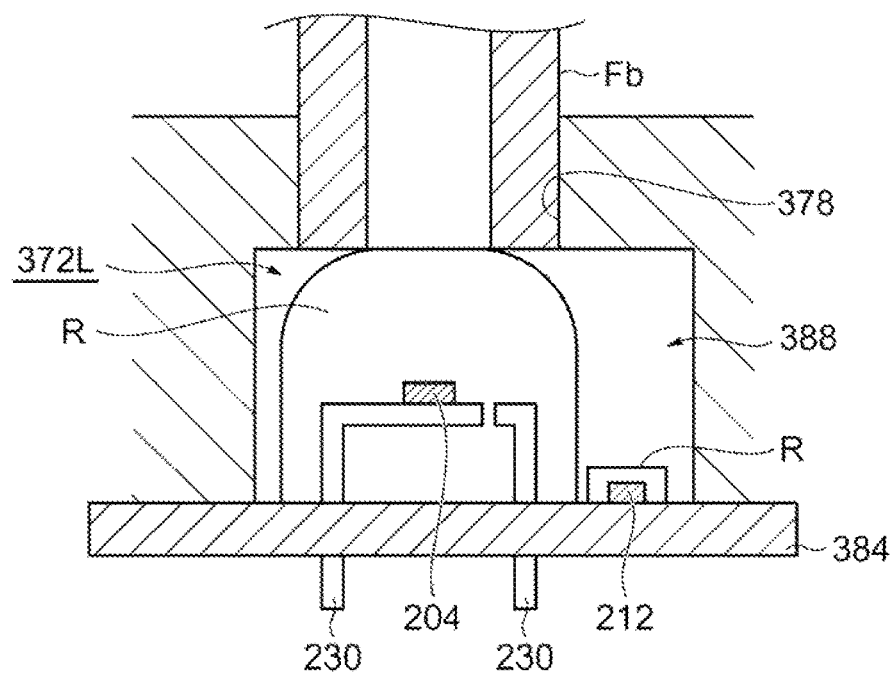
FIG. 20 is a diagram for explaining a light receiving member included in a twelfth application example.

FIG. 20 is a diagram for explaining a light receiving meme 372L included in a twelfth application example. The light receiving member 372L shown in FIG. 20 is a modification of the light receiving member 372K shown in FIG. 19. In the light receiving member 372K shown in FIG. 19, the glass plate 374 is interposed between the second insertion hole 378, which receives the optical fiber Fb for light reception, and the light reception side space 388. However, in the light receiving member 372L shown in FIG. 20, the photodiode bare chip including the lead frame 230 is surrounded by the mold resin R of the bullet type. A regular insertion assembly position of the optical fiber Fb for light reception is a position where the insertion end of the optical fiber Fb for light reception is in contact with the mold resin R of the bullet type.

Figure 21:
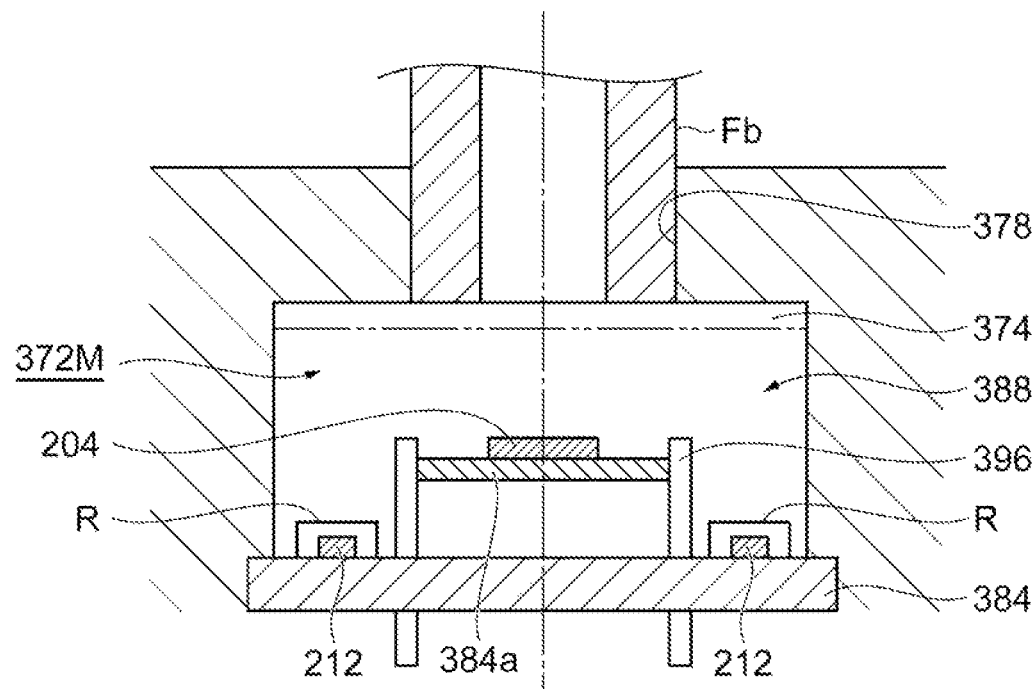
FIG. 21 is a diagram for explaining a light receiving member included in a thirteenth application example.

FIG. 21 is a diagram for explaining a light receiving member 372M included in a thirteenth application example. The light receiving member 372M shown in FIG. 21 includes the additional mounting substrate 384a located to be separated upward from the mounting substrate for light reception 384. The additional mounting substrate 384a is supported by a pedestal 396. A photodiode bare chip is mounted on the additional mounting substrate 384a. The photodiode bare chip configures the light receiving element 204. The light receiving element 204 is positioned such that the center of the light receiving element 204 coincides with the axis of the second insertion hole 378, that is, the insertion end of the optical fiber Fb for light reception.

Figure 22:
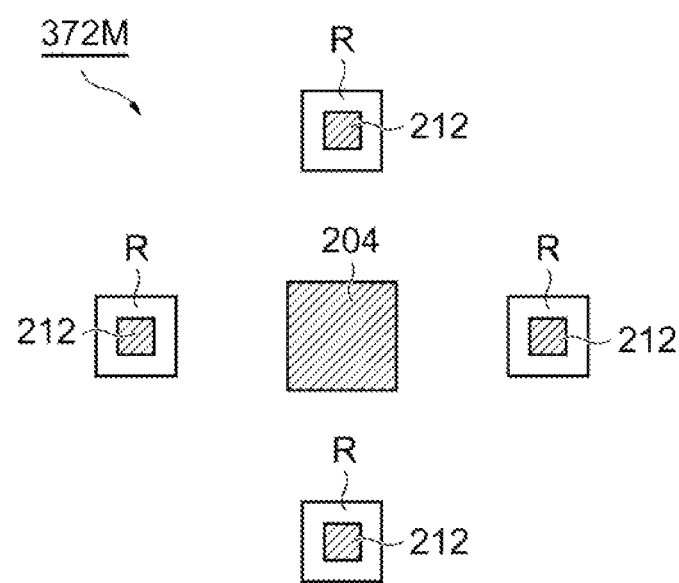
FIG. 22 is a plan view corresponding to FIG. 21.

Around the additional mounting substrate 384a on which the photodiode bare chip is mounted, the LED bare chip 212 configuring the optical light emitting element for indication 212 is mounted on the mounting substrate for light reception 384. A single optical light emitting element for indication 212 may be provided. However, a plurality of optical light emitting element for indications 212 may be provided. FIG. 22 is a plan view corresponding to FIG. 21. In FIG. 22, four optical light emitting element for indications 212 are disposed at an equal interval around the light emitting element 104 and at an equal interval from the axis of the second insertion hole 378.

All the four optical light emitting element for indications 212 may be configured by LEDs having the same color or may be configured by LEDs having different colors. When the optical light emitting element for indications 212 are configured by the LEDs having the different colors, it is possible to supply lights having various mixed colors to the optical fiber Fb for light reception by changing a combination of the LEDs to which electric power is supplied. It is possible to display different kinds of information using the various colors.

The light receiving members included in the plurality of application examples include not only the light receiving element 204 but also the optical light emitting element for indication 212. Therefore, the light receiving element 204 cannot distinguish whether the light emitted by the optical light emitting element for indication 212 is detection light received from the pair of light projecting heads 100 or display light (visible light) of the optical light emitting element for indication 212. It is desirable to take measures for making it possible to distinguish the detection light of the light projecting head 100 and the display light (the visible light) of the optical light emitting element for indication 212 or reducing an amount of the display light of the optical light emitting element for indication 212 entering the light receiving element 204.

Specifically, by adopting means for, for example, differentiating a wavelength, differentiating light emission timing, or differentiating a light emission frequency, it is desirable to carry out separation in terms of wavelength of light, in terms of light emission timing, or in terms of a light mission frequency or carry out separation in terms of wavelength of light and separation in terms of light emission timing or in terms of a light emission frequency in combination. As the means for differentiating wavelength, as explained with reference to FIGS. 11 and 12, it is desirable to provide a physical filter.

Figure 23:
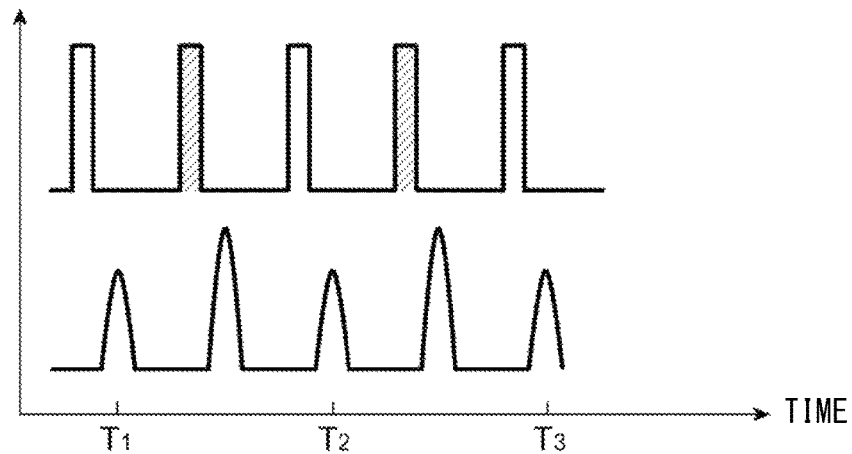
FIG. 23 is a diagram for explaining an example in which light emission timing is differentiated in order to make it possible to distinguish detection light of the light projecting head and display light of an optical light emitting element for indication.

FIG. 23 is a diagram for explaining an example in which light emission timing is differentiated. The optical light emitting element for indication 212 is caused to emit light between adjacent two light emission pulses for detection of the light emitting element 104. In FIG. 23, light emission pulses for causing the optical light emitting element for indication 212 to emit light are identified by adding hatching to the light emission pulses.

When detection timings of the light receiving element 110 are represented as T1, T2, and T3, the optical light emitting element for indication 212 emits light among the detection timings T1, T2, and T3. Therefore, the light receiving element 110 can regularly receive the light emission pulse for detection.

Figure 24:
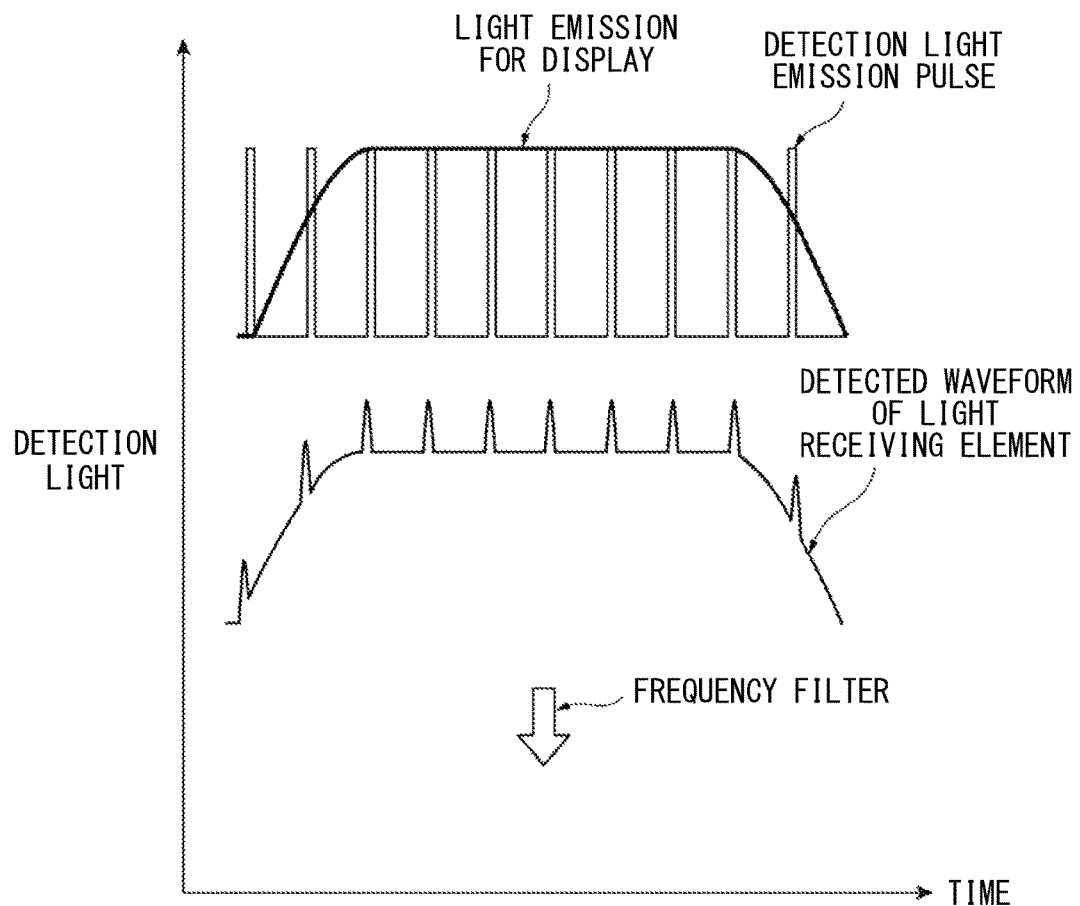
FIG. 24 is a diagram for explaining a method of separating the detection light of the light projecting head and the display light of the optical light emitting element for indication in terms of a light emission frequency in order to make it possible to distinguish the detection light of the light projecting head and the display light of the optical light emitting element for indication.

FIG. 24 is a diagram for illustratively explaining a method of separation in terms of a light emission frequency. The light emission pulse for detection of the light emitting element 104 repeats ON/OF at predetermined timing. Even if light of the optical light emitting element for indication 212 is superimposed on the light emission pulse for detection, the light receiving element 110 receives light in a state in which a waveform of the light emission pulse for detection is maintained. Consequently, by filtering an output waveform of the light receiving element 110 with a frequency filter (high-pass), it is possible to extract only the detection light emitted by the light emitting element 104.

Frequency domains used in detection and display are segmented by reducing the frequency of the light emission waveform of the optical light emitting element for indication 212 in the filtering explained with reference to FIG. 24. However, conversely to the example shown in FIG. 24, the frequency domains may be segmented by increasing the frequency of the light emission waveform of the optical light emitting element for indication 212.

The separation-type photoelectric sensor 1 including the controller 300 has a tuning function. There are the following several forms as tuning.

(1) Tuning Function (1-1) Two-point tuning: Two-point tuning can be set by pressing the set button 10 (FIG. 4) once when a detection target object is present and pressing the set button 10 once when a detection target object is absent. For example, "SET" is flashed and displayed on the display D1. A setting value is flashed. The setting value can be adjusted by the up-down button 6.

(1-2) Full-auto tuning: Full-auto tuning is set when tuning is performed using a detection target object moving at high speed.

The set button 10 is continuously pressed while causing the detection target object to pass. For example, "SET" is flashed and displayed on the display D1. After the detection target object completely passes, when a finger is released from the set button 10, a setting value is flashed. When the flashing ends and "SET" is lit, setting is completed.

(1-3) Maximum sensitivity tuning: It is possible to perform setting with fewer malfunctions even in an easily stained environment.

When the set button 10 is pressed long for three seconds or more, for example, "SET" is flashed and displayed on the display D1. A setting value is flashed. The setting value can be adjusted by the up-down button 6. When the flashing ends, setting is completed.

(1-4) Positioning tuning: It is possible to perform setting suitable for positioning. The set button 10 is pressed once in a state in which a detection target object is absent. When a detection target object is placed in a positioning desired position and the set button 10 is pressed long for three seconds or more, "SET" is flashed and displayed on the display D1. A setting value is flashed. The setting value can be adjusted by the up-down button 6.

Figure 25:
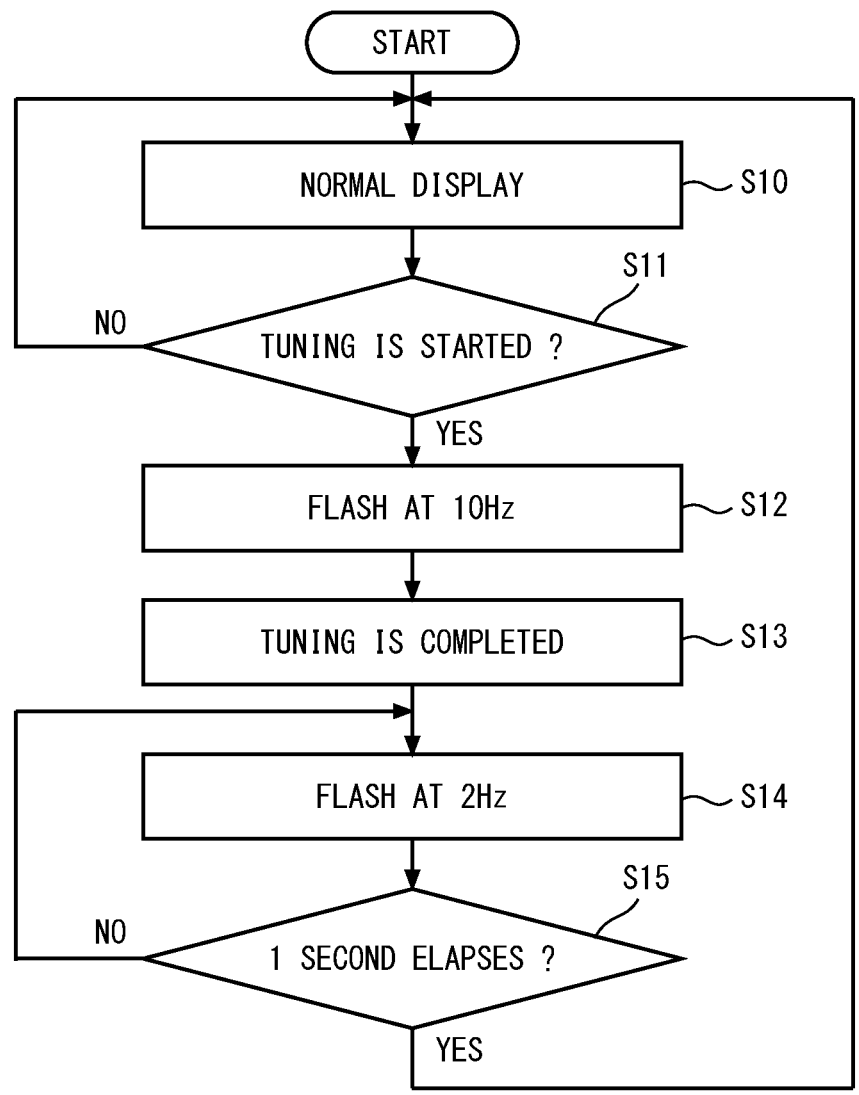
FIG. 25 is a flowchart for explaining an example of control for causing the light projecting head and/or the light receiving head to emit display lights during tuning.

In the tuning including the forms of (1-1) to (1-4), it is desirable to cause the light projecting head 100 and/or the light receiving head 200 to emit display lights simultaneously with the display on the display D1. FIG. 25 is a flowchart for explaining an example of the display. In the display example shown in FIG. 25, during the operation of the photoelectric sensor 1, every time a detection target object is detected, that is, in every ON/OFF, the display lights of the light projecting head 100 and/or the light receiving head 200 are lit or flashed in synchronization with the detection of the detection target object. This is referred to as "normal display". Referring to FIG. 25, in the photoelectric sensor 1, the "normal display" is executed during the detecting operation (S10). When the tuning is started on the basis of operation of the set button 10 of the controller 300, that is, an instruction from the outside, processing proceeds from step S11 to step S12. For example, the display light of the light receiving head 200 is flashed at a cycle of 10 Hz (a first display light mode). By viewing the flashing of the display light, the photoelectric sensor 1 can confirm that the photoelectric sensor 1 is in a tuning mode. When the tuning is completed (S13), for example, the flashing of the display light of the light receiving head 200 is changed from 10 Hz to 2 Hz (S14: a second display light mode). The flashing is executed for one second (S15). A user may confirm the display on the display D1. However, by viewing a change in a flashing cycle of the display lights of the light projecting head 100 and/or the light receiving head 200 without viewing the display on the display D1, the user can confirm that the tuning is completed and the photoelectric sensor 1 is performing the normal operation.

In the example explained above, the flashing cycle is changed in the change from the first display light mode to the second display light mode. However, (a) a color of the display light, (b) the number of times of the flashing, or (c) a cycle of the intensity of the display may be changed.

The photoelectric sensor 1 further includes a preset function and a zero-shift function.

(2) Preset function: It is possible to correct "100.0" and "0.0" of sensitivity setting and a display light reception amount. By using this function, it is possible to correct any two points to display light reception amounts "100.0" and "0.0". When the preset button 12 and, for example, a down (DOWN) side of the up-down button 6 are pressed, a light reception amount at that point in time is set to "0.0".

(1-1) Maximum sensitivity preset: Maximum sensitivity preset is a function effective when it is desired to detect a detection target object on the basis of a background in a reflection type. In the reflection type, the preset button 12 is pressed long for three seconds or more in a state in which a detection target object is absent. In a transmission type, the preset button 12 is pressed long for three seconds or more in a state in which a detection target object is present. For example, "AUTO" is flashed on the display D1. When the flashing ends and "AUTO" is lit, setting is completed. A setting value is set to "50.0".

(1-2) Full-auto preset: It is possible to automatically discriminate presence/absence of a detection target object and correct a present value to "100.0" and "0.0". When the preset button 12 is continuously pressed while causing a detection target object to pass, "AUTO" is flashed. After the detection target object completely passes, when a finger is released from the preset button 12, a setting value is flashed. When the flashing ends and "AUTO" is lit, setting is completed. A setting value is set to "50.0".

(3) Zero-shift function: A zero-shift function is a function of setting display of a present light reception amount to "0". When a light reception amount is not "0" because of the influence of a background or the like when a detection target object is absent, a difference in the light reception amount is easily seen by setting display of the light reception amount to "0" using the zero-shift function. When the preset button 12 and the down (DOWN) side of the up-down button 6 are simultaneously pressed, display of a light reception amount at that point in time changes to "0", In the application examples explained with reference to FIG. 6 and the like, for example, in the second application example shown in FIG. 10, the light receiving member 372B includes the light receiving element 204 and the optical light emitting element for indication 212 and the light projecting member 370B includes the light emitting element 104 that emits detection light and the optical light emitting element for indication 120. The optical light emitting element for indication 212 of the light receiving member 372B emits light simultaneously with the display of the display D1 and/or the display lamp 16. Consequently, the display light can cause the light receiving head 200 to emit light through the optical fiber Fb for light reception. On the other hand, the optical light emitting element for indication 120 of the light projecting member 370B emits light simultaneously with the display of the display D1 and/or the display lamp 16. Consequently, the display light can cause the light projecting head 100 to emit light through the optical fiber Fb for light projection.

By causing the light projecting head 100 and/or the light receiving head 200 to emit lights simultaneously with the display of the display D1 and/or the display lamp 16, it is possible to cause the light projecting head 100 and/or the light receiving head 200 to redundantly perform a part of various display functions of the controller 300. Consequently, an operator does not need to take the eyes off the light projecting head 100 and/or the light receiving head 200 at hand and confirm the controller 300. This is specifically and illustratively explained below.

The display lights of the light projecting head 100 and/or the light receiving head 200 are used in relation to the preset function of (2). The display lights of the light projecting head 100 and/or the light receiving head 200 are lit or flashed while being triggered by, for example, the start of the preset. The display lights of the light projecting head 100 and/or the light receiving head 200 are extinguished while being triggered by the completion of the preset.

The display lights of the light projecting head 100 and/or the light receiving head 200 are used in relation to the zero-shift function of (3). The display lights of the light projecting head 100 and/or the light receiving head 200 are lit or flashed while being triggered by, for example, the start of the zero-shift. The display lights of the light projecting head 100 and/or the light receiving head 200 are extinguished while being triggered by the completion of the zero-shift.

(1) to (3) explained above are only illustrations. In relation to the functions of the photoelectric sensor to be applied, when a function currently in use is a function desirably visually displayed, it is desirable to light or flash the display lights of the light projecting head 100 and/or the light receiving head 200. Naturally, in order to distinguish a difference among the tuning, the preset, and the zero-shift, a flashing cycle may be differentiated, a lighting color may be differentiated, or a combination of the color and the flashing cycle may be differentiated.

That is, the distinction by the display lights of the light projecting head 100 and/or the light receiving head 200 can be performed according to (a) the color of the display light, (b) the number of times of the flashing, (c) the flashing cycle, (d) the cycle of the intensity of the display, (e) the switching cycle of the plurality of display colors, and the like.

For example, a pair of the light projecting head 100 and the light receiving head 200 related to a specific controller 300 can be specified by causing the light projecting head 100 and/or the light receiving head 200 to emit lights. This is called "pairing". The "pairing" includes the following two forms. A first form is a pair of the light projecting head 100 or the light receiving head 200 and the controller 300. A second form is a pair of the light projecting head 100 and the light receiving head 200. When a plurality of light projecting heads 100, a plurality of light receiving heads 200, and a plurality of controllers 300 are complicated, by using the display lights of the light projecting head 100 and/or the light receiving head 200, it is possible to easily specify to which controller 300 the light projecting head 100 held by the operator is coupled.

It is possible to easily specify the pairing by differentiating a way of the emission of the display lights of the plurality of light projecting heads 100 and/or the light receiving heads 200, that is, (a) to (e) explained above to, for example, cause, according to a light reception amount, the optical light emitting element for indication to emit light in a lighting or flashing state corresponding to the light reception amount.

Figure 26:
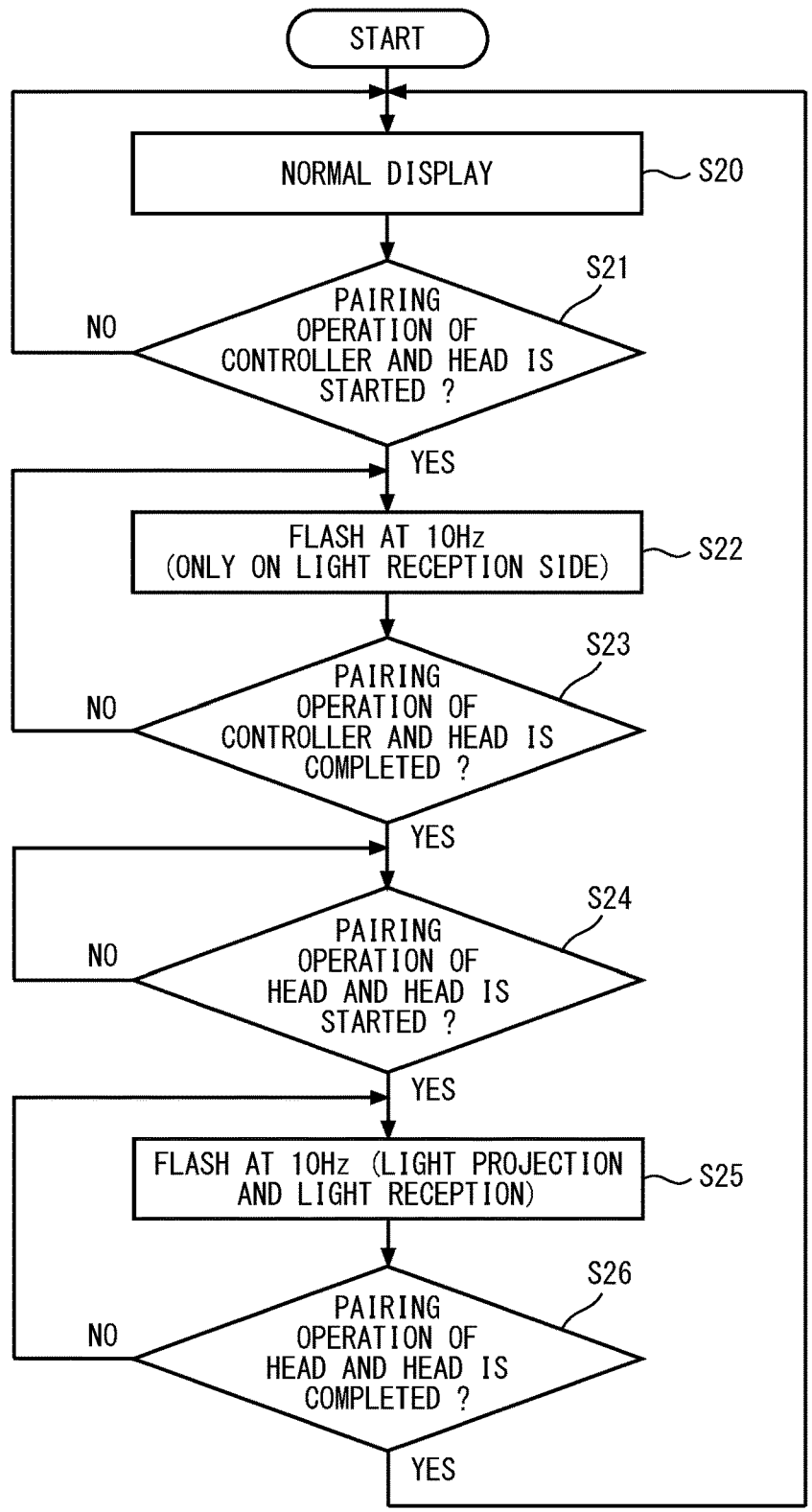
FIG. 26 is a flowchart for explaining an example of control for causing the light projecting head and/or the light receiving head to emit display lights during pairing operation.

An example of control for causing the light projecting head 100 and/or the light receiving head 200 to emit display lights in the "pairing" is explained with reference to a flowchart of FIG. 26. "Normal display" in step S20 shown in FIG. 26 corresponds to the "normal display" in step S10 of FIG. 25 explained above. When operation for executing the pairing between the controller and the head included in button operation of the controller 300 is performed (S21), the display light of the light receiving head 200 is flashed at a cycle of 10 Hz on the basis of this instruction from the outside (S22). By viewing this flashing display, it is possible to specify the light receiving head 200 related to the controller 300. Subsequently, when operation for completing the pairing between the controller and the head is performed (S23), the display returns to the "normal display" (S20). Separately from the return to the "normal display", operation for executing the pairing between the light projecting head 100 and the light receiving head 200 is performed (S24). When the held light projecting head 100 and the held light receiving head 200 are opposed and the held light projecting head 100 and the held light receiving head 200 are the light projecting head 100 and the light receiving head 200 forming a pair, the display light of both of the light projecting head 100 and the light receiving head 200 are flashed at a cycle of 10 Hz (S22). By viewing the flashing display of both of the light projecting head 100 and the light receiving head 200, it is possible to confirm that the light projecting head 100 and the light receiving head 200 are a pair of the heads 100 and 200.

When, for example, detection light is used in relation to the pairing, the operation may automatically return to the detecting operation when a predetermined time elapses from the operation for the pairing start in steps S10 and S24, that is, the instruction from the outside. It is desirable to perform display of an inquiry "the detecting operation may be stopped?" on the display D1 or D2 of the controller 300 when the operation for the pairing start in steps S10 and S24 is performed. It is desirable to perform display of an inquiry "the detecting operation may be automatically restored in a predetermined time after this operation?" on the display D1 or D2 of the controller 300 when the operation for the pairing start in steps S10 and S24 is performed. A time until the restoration may be displayed to enable a setting change of the time.

By using the display lights of the light projecting head 100 and/or the light receiving head 200 when optical axis adjustment is performed, as explained with reference to FIG. 25, with the display for causing the light projecting head 100 and/or the light receiving head 200 to emit the display lights, it is possible to confirm that the optical axes are aligned without necessity of confirming the display of the controller 300.

Degrees of coincidence of the optical axes, that is, degrees of complete coincidence of the optical axes, substantial coincidence of the optical axes, and the optical axis not being considered to coincide (unstable) may be displayed by differentiating a way of causing the light projecting head 100 and/or the light receiving head 200 to emit display lights, that is, differentiating (a) to (e) explained above. The degrees may be classified according to, for example, ratios of a light reception signal to a threshold: 200% or more (complete coincidence), a ratio equal to or higher than the threshold (substantial coincidence), a ratio near the threshold (unstable), a ratio equal to or lower than the threshold, and the like. In this way, the way of causing the light projecting head 100 and/or the light receiving head 200 to emit display lights may be differentiated to clearly show that the optical axes are sufficiently aligned. Naturally, lighting or flashing display corresponding to a light reception amount may be performed.

A state of the controller 300 may be displayed by causing the light projecting head 100 and/or the light receiving head 200 to emit lights. For example, the light projecting head 100 and/or the light receiving head 200 may be caused to emit lights during the start of the controller 300 or may be caused to emit light when abnormality of a light reception amount occurs during the start of the controller 300. Specifically, a standard light reception amount during a start may be set in advance. Abnormality may be determined when a light reception amount is excessively larger or smaller than this setting value to cause the light projecting head 100 and/or the light receiving head 200 to emit lights. Away of display may be differentiated when the light reception amount is too large and when the light reception amount is too small. Naturally, lighting or flashing display corresponding to the light reception amount may be performed. Normality of the operation of the controller 300 may be displayed by causing the light projecting head 100 and/or the light receiving head 200 to emit lights.

When abnormality occurs in the operation of the controller 300, the light projecting head 100 and/or the light receiving head 200 may be caused to emit lights to display to that effect using the light projecting head 100 and/or the light receiving head 200. Details of the abnormality may be displayed by differentiating a way of causing the light projecting head 100 and/or the light receiving head 200 to emit display lights, that is, differentiating (a) to (e) explained above. Examples of the "abnormality" include an alarm state, an error state, occurrence of mutual interference, and heat generation of the controller 300.

When the controller 300 is an output type, that is, a type for performing two outputs, that is, a main output and a sub-output, it is desirable to cause the light projecting head 100 and/or the light receiving head 200 to emit display lights in association with a second output.

It is desirable to identifiably differentiate display related to detection and display related to the operation of the functions of the controller 300. Examples of a way of identifiably differentiating the displays include differentiating (i) a color of display light, (ii) the number of times of flashing, (iii) a flashing cycle, (iv) a cycle of intensity of display, and (v) a switching cycle of a plurality of display colors.

It is desirable to identifiably differentiate displays respectively related to operation of a first function and operation of a second function of the controller 300. Examples of a way of identifiably differentiating the displays include differentiating (i) a color of display light, (ii) the number of times of flashing, (iii) a flashing cycle, (iv) a cycle of intensity of display, and (v) a switching cycle of a plurality of display colors.

In display related to setting of the functions of the controller 300, display related to setting of the first function and display related to setting of the second function may be identifiably differentiated. Examples of a way of identifiably differentiating the displays include differentiating (i) a color of display light, (ii) the number of times of flashing, (iii) a flashing cycle, (iv) a cycle of intensity of display, and (v) a switching cycle of a plurality of display colors.

The functions of the controller 300 are explained. When the controller 300 has functions of one shot, ON delay, and OFF delay, it is desirable to cause the light projecting head 100 and/or the light receiving head 200 to emit display lights in association with these functions. The user sets these various functions, a "one shot" function explained below, and the like while viewing display on the displays D1 and D2. It is possible to improve convenience of the user by causing the light projecting head 100 and/or the light receiving head 200 to emit display lights simultaneously with the display.

The "one shot" function is a function of, for example, when a detection target object is detected, outputting an ON signal, which is generated only once according to the detection, for a fixed time from a rising edge of the ON signal without being affected by a period in which the detection target object is detected. The "ON delay" function is a function of setting a delay time at the time when the controller 300 sends the ON signal to an external apparatus. The "OFF delay" function is a function of setting a delay time at the time when the controller 300 sends an OFF signal to the external apparatus.

When the "one shot" function is set, an output is instantaneously performed. It is desirable to cause the light projecting head 100 and/or the light receiving head 200 to emit display lights for a time longer than a period of the output. When the "ON delay" function or the "OFF delay" function is set, it is desirable to cause the light projecting head 100 and/or the light receiving head 200 to emit display lights according to the delay.

The light projecting head 100 and/or the light receiving head 200 may be caused to emit display lights when an upper lid 4 (FIG. 3) of the controller 300 is opened or closed. It is desirable to cause the light projecting head 100 and/or the light receiving head 200 to emit display lights when the optical fiber Fb, which is the light propagation member, between the controller 300 and the light projecting head 100 is deeply inserted into the first insertion hole 376 (FIG. 6) of the controller 300 and/or when the optical fiber Fb, which is the light propagation member, between the controller 300 and the light receiving head 200 is deeply inserted into the second insertion hole 378 (FIG. 6) of the controller 300, that is, when regular setting of the optical fibers Fb for light projection and light reception is completed. Consequently, it is possible to confirm that assembly work of the optical fibers Fb for light projection and light reception is regularly completed.

It is desirable to cause the light projecting head 100 or the light receiving head 200 to emit display light when abnormality occurs in the light projecting head 100 and the light receiving head 200 and the optical fibers Fb for light projection and light reception. It is desirable to cause the light projecting head 100 or the light receiving head 200 to emit display light when stain occurs in the light projecting head 100 or the light receiving head 200.

It is desirable to cause the light projecting head 100 or the light receiving head 200 to emit display light when an error occurs in communication between the photoelectric sensors or between the photoelectric sensor and the PLC.

When a system is constructed by a combination of the pluralities of light projecting heads 100 and light receiving heads 200 and the plurality of controllers 300, in order to distinguish a first controller 300 and the light projecting head 100 and the light receiving head 200 connected to the first controller 300 and a second controller 300 and the light projecting head 100 and the light receiving head 200 connected to the second controller 300, concerning the first controller 300, the light projecting head 100 or the light receiving head 200 may be caused to emit display light, for example, at a time interval of 1 sec and, concerning the second controller 300, the light projecting head 100 or the light receiving head 200 may be caused to emit display light, for example, at a time interval of 2 sec.

When setting is written from master sets to slave sets in the plurality of controllers 300, the light projecting head 100 or the light receiving head 200 may be caused to emit display light to enable the heads to inform reception completion.

When communicating with, for example, a unit that mediates other communication apparatuses, an IO-Link, a cc-Link, or an open network and the controller 300, the light projecting head 100 or the light receiving head 200 may be caused to emit display light in order to clarify success or failure of the communication. Naturally, it is desirable to cause the light projecting head 100 or the light receiving head 200 to emit display light while displaying predetermined display content on display units of the other communication apparatuses and the other controllers 300.

What is claimed is:

1. A photoelectric sensor comprising:
    a light emitting element configured to project detection light toward a detection region;
    a light receiving element configured to receive the detection light reflected from the detection region;
    a connecting section for light projection to which a light propagation member for light projection optically coupled to the light emitting element is connected;
    a connecting section for light reception to which a light propagation member for light reception optically coupled to the light receiving element is connected;
    a signal generating unit configured to compare a light reception signal generated by the light receiving element and a threshold and generate a detection signal indicating a result of the comparison;
    an optical light emitting element for indication which is optically coupled to at least one of the connecting section for light reception and the connecting section for light projection and configured to emit visible light and project an indication light in response to the light reception signal; and
    a control unit configured to light the optical light emitting element for indication according to a light reception state of the light receiving element on the basis of the light reception signal and light the optical light emitting element for indication on the basis of an instruction from an outside.

2. The photoelectric sensor according to claim 1, wherein the instruction from the outside is an instruction based on an input of a user.

3. The photoelectric sensor according to claim 2, wherein the instruction based on the input of the user is an input via a button provided in the photoelectric sensor.

4. The photoelectric sensor according to claim 1, wherein the instruction from the outside is either one of an input from an IO terminal and an input via another photoelectric sensor or a communication unit.

5. The photoelectric sensor according to claim 1, wherein lighting corresponding to a light reception state of the light emitting element based on the light reception signal and lighting based on the instruction from the outside are different in a display form of display light.

6. The photoelectric sensor according to claim 5, wherein the difference in the display form of the display light is any one of a difference in a display color, a number of times of display flashing, a cycle of display flashing, a cycle of intensity of display, and a switching cycle of a plurality of display colors.

7. The photoelectric sensor according to claims 1, further comprising a display unit, wherein
    the photoelectric sensor performs predetermined display on the display unit and causes the optical light emitting element for indication to emit light.

8. The photoelectric sensor according to claim 1, wherein the photoelectric sensor causes, according to a light reception amount, the optical light emitting element for indication to emit light in a lighting or flashing state corresponding to the light reception amount.

9. The photoelectric sensor according to claim 1, further comprising a display lamp for displaying an output state to the outside, wherein
    the optical light emitting element for indication is associated with the display lamp of the photoelectric sensor.

10. The photoelectric sensor according to claim 1, wherein
    another apparatus connected to the photoelectric sensor includes a display device, and
    the optical light emitting element for indication is associated with the display device of the other apparatus.

11. The photoelectric sensor according to claim 1, further comprising a switch configured to maintain the optical light emitting element for indication in a predetermined state irrespective of a light reception amount in the light receiving element.

12. The photoelectric sensor according to claim 1, wherein the photoelectric sensor is capable of switching a mode between a first mode for changing a lighting state of the optical light emitting element for indication on the basis of a light reception amount in the light receiving element and a second mode for maintaining the lighting state of the optical display light emitting state irrespective of the light reception amount in the light receiving element.

13. The photoelectric sensor according to claim 12, wherein the photoelectric sensor is capable of changing the mode from the first mode to the second mode after optical axis alignment of projected light and received light ends.

14. The photoelectric sensor according to claim 12, wherein lighting in the optical light emitting element for indication in the second mode is performed on the basis of the instruction from the outside or performed on the basis of a state of an element other than the light receiving element inside the photoelectric sensor.

15. The photoelectric sensor according to claim 1, wherein the optical light emitting element for indication is lit when abnormality occurs inside the controller.

16. The photoelectric sensor according to claim 1, wherein the optical light emitting element for indication and the light receiving element are provided in common transparent mold.

17. The photoelectric sensor according to claim 1, wherein a filter member having a wavelength-selective light absorbing ability is provided between the light receiving element and the optical light emitting element for indication.

18. The photoelectric sensor according to claim 1, wherein the optical light emitting element for indication and the light receiving element are provided substantially coaxial.

19. The photoelectric sensor according to claim 1, wherein the optical light emitting element for indication are positioned to be substantially coaxial with the connecting section for light reception.

20. The photoelectric sensor according to claim 1, further comprising an element holder, wherein
    the element holder includes:
        a fiber hole for light projection into which the light propagation member for light projection is inserted;
        a fiber hole for light reception into which the light propagation member for light reception is inserted;
        a light-projecting-unit housing unit configured to house the light projecting unit; and a light-receiving-unit housing unit configured to house the light receiving unit.

* * * * *

UNITED STATES PATENT AND TRADEMARK OFFICE
CERTIFICATE OF CORRECTION

PATENT NO. : 10,203,462 B2
APPLICATION NO. : 15/928518
DATED : February 12, 2019
INVENTOR(S) : Kazuhiro Makino et al.

Page 1 of 1

It is certified that error appears in the above-identified patent and that said Letters Patent is hereby corrected as shown below:

In the Claims

In Column 25, Line 61, In Claim 7, Delete "claims" and insert -- claim --, therefor.

Signed and Sealed this
Twenty-third Day of April, 2019

Andrei Iancu
*Director of the United States Patent and Trademark Office*